(12) United States Patent
Peng et al.

(10) Patent No.: US 9,531,280 B2
(45) Date of Patent: Dec. 27, 2016

(54) ISOLATION DEVICE AND SYSTEM

(71) Applicant: Avago Technologies General IP (Singapore) Pte. Ltd., Singapore (SG)

(72) Inventors: Jia Peng, Singapore (SG); Fun Kok Chow, Singapore (SG); Chee Heng Wong, Singapore (SG); Kwee Chong Chang, Singapore (SG)

(73) Assignee: Avago Technologies General IP (Singapore) Pte. Ltd., Singapore (SG)

( * ) Notice: Subject to any disclaimer, the term of this patent is extended or adjusted under 35 U.S.C. 154(b) by 278 days.

(21) Appl. No.: 14/273,915

(22) Filed: May 9, 2014

(65) Prior Publication Data
US 2015/0323588 A1    Nov. 12, 2015

(51) Int. Cl.
| | | |
|---|---|---|
| *H02M 3/335* | (2006.01) | |
| *G01R 31/28* | (2006.01) | |
| *H05B 33/08* | (2006.01) | |
| *H02H 3/24* | (2006.01) | |
| *H05B 37/00* | (2006.01) | |
| *H02M 1/00* | (2006.01) | |

(52) U.S. Cl.
CPC ...... *H02M 3/33523* (2013.01); *G01R 31/2836* (2013.01); *H02H 3/24* (2013.01); *H02M 3/33507* (2013.01); *H05B 33/0815* (2013.01); *H05B 37/00* (2013.01); *H02M 2001/0003* (2013.01)

(58) Field of Classification Search
CPC .. G01R 31/2836; H02M 3/33507; H02H 3/24; H04B 33/0815
See application file for complete search history.

(56) References Cited

U.S. PATENT DOCUMENTS

| | | |
|---|---|---|
| 5,237,310 A | 8/1993 | Smith |
| 6,181,086 B1 | 1/2001 | Katyl et al. |
| 6,225,927 B1 | 5/2001 | Scott |
| 6,388,396 B1 | 5/2002 | Katyl et al. |
| 6,389,063 B1 | 5/2002 | Kanekawa et al. |

(Continued)

FOREIGN PATENT DOCUMENTS

| | | |
|---|---|---|
| EP | 1715586 | 10/2006 |
| KP | 100987727 | 10/2010 |

OTHER PUBLICATIONS

"Co-pending U.S. Appl. No. 13/858,789, filed Apr. 8, 2013".

(Continued)

*Primary Examiner* — Matthew Nguyen

(57) ABSTRACT

An isolation device having first and second semiconductor is disclosed. The first semiconductor die may be adapted to transmit a first signal to the second semiconductor die that is electrically isolated. The first semiconductor die may have a transmitter coupled to a modulator that modulates the first signal. The second semiconductor die may have a receiver having a counter and a control circuit. The control circuit may be adapted to determine an indication of the first signal by using the counter. In addition, an isolation system and a DC-DC feedback regulation control system having such control circuit are disclosed. Likewise, a method for conveying a first signal across an isolation barrier is disclosed. The method may comprise counting a received signal based on internal clock and determining an indication of the first signal from the counter's count value.

20 Claims, 18 Drawing Sheets

(56) References Cited

U.S. PATENT DOCUMENTS

| | | | |
|---|---|---|---|
| 6,570,343 | B1 | 5/2003 | Shoji et al. |
| 6,611,553 | B1 | 8/2003 | Scott et al. |
| 7,009,534 | B2 | 3/2006 | Nachamiev et al. |
| 7,020,189 | B2 | 3/2006 | Sweitzer et al. |
| 7,098,821 | B2 * | 8/2006 | Husted .............. H04L 7/0029 341/61 |
| 7,439,764 | B2 | 10/2008 | Twigg et al. |
| 7,525,365 | B1 | 4/2009 | Henry |
| 7,571,063 | B2 | 8/2009 | Howell et al. |
| 7,701,731 | B2 | 4/2010 | Dhuyvetter et al. |
| 7,864,546 | B2 | 1/2011 | Dhuyvetter et al. |
| 7,920,010 | B2 | 4/2011 | Chen |
| 8,289,011 | B2 | 10/2012 | Vigelius |
| 8,462,003 | B2 | 6/2013 | Ng et al. |
| 8,552,695 | B2 | 10/2013 | Stracquadaini |
| 8,724,683 | B2 * | 5/2014 | Baba .............. G01R 31/31707 375/224 |
| 2003/0127997 | A1 | 7/2003 | Shoji et al. |
| 2011/0019446 | A1 | 1/2011 | Wu et al. |
| 2012/0242378 | A1 | 9/2012 | Taghivand et al. |
| 2013/0163688 | A1 | 6/2013 | Calvin |
| 2013/0257527 | A1 | 10/2013 | Dong |
| 2014/0226708 | A1 * | 8/2014 | Yang ....................... H03K 7/08 375/238 |

OTHER PUBLICATIONS

"Quad-Channel, 2.5 Kv Isolators With Integrated DC-To-DC Converter", *Amtel Corporation, 2005* 2005.

"Watchdog IC ATA6025", *Amtel Corporation, 2005* 2005.

Avago Technologies, , "40 ns Propagation Delay, CMOS Optocoupler", Jun. 10, 2000.

Avago Technologies, , "HCNR200 and HCNR201 High-Linearity Optocouplers", Nov. 18, 2008.

Chen, Baoxing et al., "High Speed Digital Isolators Using Microscale On-Chip Transformers", *Elektronik Magazine* Jul. 22, 2003 , 1-6.

Hatzidakis, et al., "Multichannel Data Transmission Through a Fiber Optic Cable", URL://hdl.handle.net/10945/22375> 1987 1987, 1-105.

Ho, Edward et al., "Ramp Signal Generation in Voltage Mode CCM Random Switching Frequency Buck Converter for Conductive EMI Reduction", *IEEE*, 2010 pp. 1-4 2010.

"Isolation Technologies for Reliable Industrial Measurements", National Instruments, Sep. 26, 2013, 2013, 1-7.

Coffey, "Analog Transmission Across Digital Barriers", 2006, Bodo's Power, Devices and Components, September, Signal Isolators. Downloaded from website <www.powerguru.org>, 2006, 6 pages.

* cited by examiner

ISOLATION DEVICE AND SYSTEM

BACKGROUND

An isolation device provides a means for moving a signal from one electrical circuit to another electrical circuit when the two electrical circuits must otherwise be electrically isolated from one another. Usually the two electrical circuits operate at different voltages, and thus, must be electrically isolated. For example, consider an application in which a 5V battery-powered controller board is utilized to control a motor circuit operating at 240V. In this example, it is essential to electrically isolate the 240V motor circuits from the 5V controller circuit, while permitting the 5V controller circuit to send or receive signals from the 240V motor circuit. In this type of application, an isolation device may be used to provide voltage and noise isolation, while permitting the information exchange between the two circuit systems. For electrical system with more than two circuits operating at different voltages, a multichannel isolation device may be used.

In an isolated system where two or more signals are transmitted across an isolation barrier, an equivalent number of isolation devices are typically required to transmit the signals across the isolation barrier. The requirement for equivalent number of isolation devices adds to cost. Furthermore, in some cases it may not be feasible to employ two isolation devices in an integrated circuit package due to space constraints.

BRIEF DESCRIPTION OF THE DRAWINGS

Illustrative embodiments by way of examples, not by way of limitation, are illustrated in the drawings. Throughout the description and drawings, similar reference numbers may be used to identify similar elements. The drawings may be for illustrative purpose to assist understanding and may not be drawn per actual scale. For example, timing charts for some embodiments may be drawn out of proportion to enhance understanding.

DETAILED DESCRIPTION

Figure 1A:
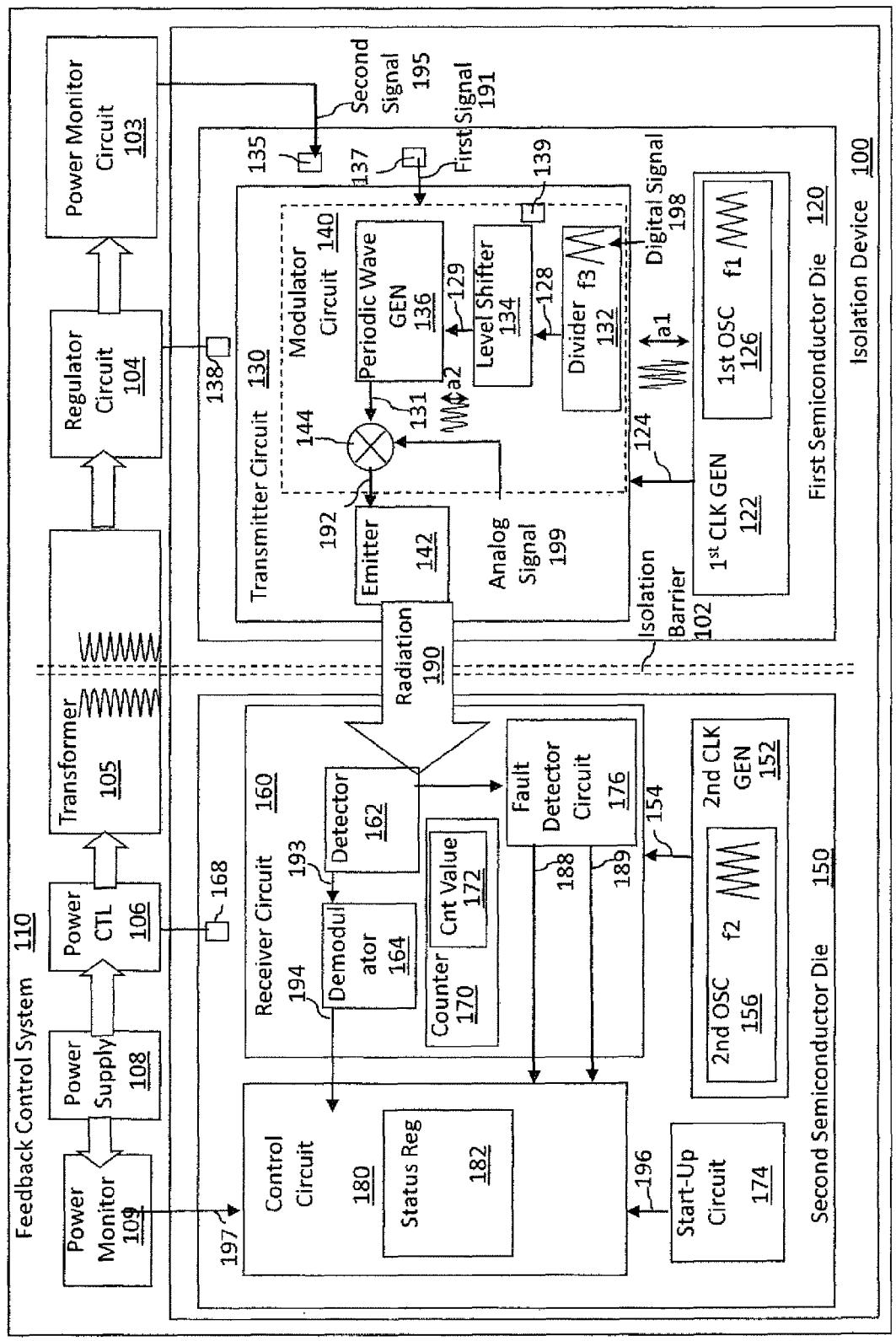
FIG. 1A shows an illustrative block diagram of an isolation device.

FIG. 1A shows an illustrative block diagram of an isolation device 100. The isolation device 100 may comprise a first semiconductor die 120 and a second semiconductor die 150. The second semiconductor die 150 may be located adjacent to but electrically isolated from the first semiconductor die 120. For example, the first semiconductor die 120 and the second semiconductor die 150 may be formed within a lead frame package (not shown) or any other type of packaging used to house or contain the first and second semiconductor dies 120, 150. The first semiconductor die 120 and the second semiconductor die 150 may be spaced apart and separated by an isolation barrier 102 (also referred as an isolation material 102) that electrically isolates the first semiconductor die 120 from the second semiconductor die 150. The isolation material 102 may be an insulation material such as epoxy, silicone, ceramic or any other electrical insulation materials. In one embodiment, the isolation material 102 may comprise high voltage insulation material such as a kapton tape. The first semiconductor die 120 and the second semiconductor die 150 may be arranged facing each other in the lead frame package. Alternatively, the first semiconductor die 120 and the second semiconductor die 150 may be formed on a common substrate such as a printed circuit board. In another embodiment, the first semiconductor die 120 and the second semiconductor die 150 may be formed on one or two lead frames (not shown) that may be arranged in close proximity within a package but separated by a high voltage insulating material.

The first semiconductor die 120 may comprise a first clock generator 122. The first clock generator 122 may be provided within the first semiconductor die 120 to generate a first clock signal 124 having a first frequency f1. The first clock generator 122 may be optional. In another embodiment without the first clock generator 122, the first clock signal 124 may be generated outside the first semiconductor die 120. The first clock generator 122 may comprise a first oscillator 126. Similarly, the second semiconductor die 150 may comprise a second clock generator 152. The second clock generator 152 may be provided within the second semiconductor die 150 to generate a second clock signal 154 having a second frequency f2. The second clock signal 154 may be independent from the first clock signal 124. The second clock generator 152 may be optional, and in such circumstances, the second clock signal 154 may be generated outside the second semiconductor die 150. The second clock generator 152 may comprise a second oscillator 156.

Figure 1B:
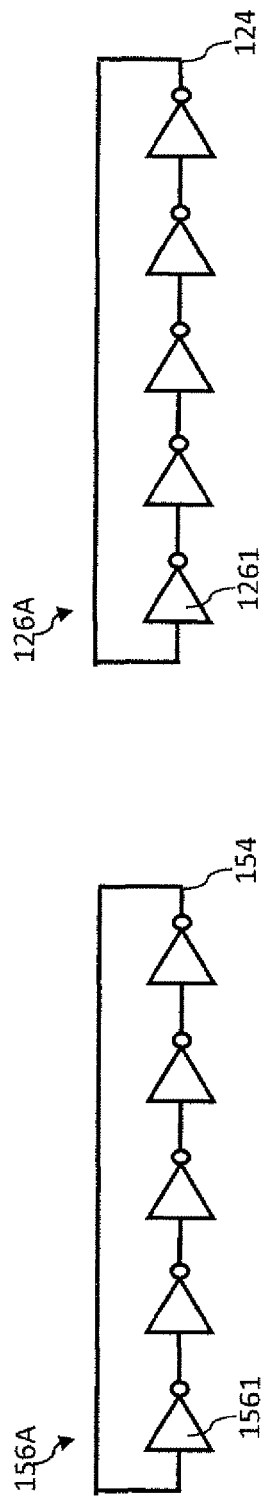
FIG. 1B shows illustrative circuit diagrams of first and second oscillators.

The isolation device 100 may be beneficial in that a low cost standalone oscillator may be adequate without having to use a high-end oscillator. For example, one circuit implementation of the first and second oscillators 126, 156 may be first and second ring oscillators 126A, 156A as shown in FIG. 1B. FIG. 1B shows an illustrative circuit diagram of first and second oscillators 126, 156. Each of the first and second ring oscillators 126A, 156A may comprise a plurality of inverters 1261, 1561 configured to generate the first and second clock signals 124, 154 respectively. The number of the plurality of inverters 1261, 1561 may be an odd number.

The first frequency f1 generated in different first semiconductor dies 120 may vary between 20-40% due to manufacturing process variations of the first semiconductor die 120. Similarly, the second frequency f2 generated in different second semiconductor dies 150 may vary between 20-40% due to manufacturing process variations of the second semiconductor die 150. In one embodiment, the first clock generator 122 and the second clock generator 152 may comprise a plurality of similar or identical components having substantially similar or identical dimensions. Each of the plurality of similar or identical components may be arranged in a substantially similar or identical orientation. For example, the first and second clock generators 122, 152 may comprise first and second ring oscillators 126A, 156A respectively having same number of inverters 1261, 1561 as shown in FIG. 1B.

Figure 1C:
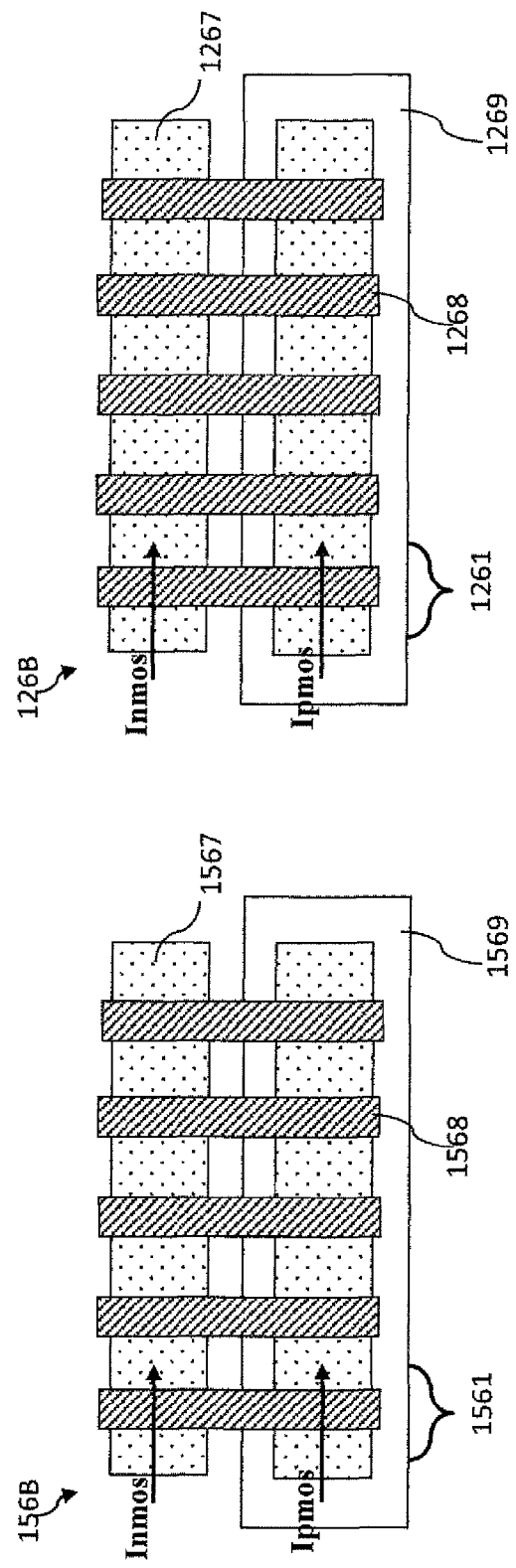
FIG. 1C shows illustrative layouts of the oscillators shown in FIG. 1B.

FIG. 1C shows an illustrative layout views 126B, 156B of the first and second ring oscillators 126A, 156A illustrated in FIG. 1B. The layout views 126B, 156B may comprise active regions 1267, 1567, poly-silicon regions 1268, 1568, and NWELL regions 1269, 1569 that may form an NMOS transistor or a PMOS transistor. As shown in FIG. 1C, the first and second clock generators 122, 152 may comprise similar or identical composition, i.e. having similar components of NMOS transistors and PMOS transistors arranged in similar dimension and orientation. Current flow directions of the NMOS transistors $I_{NMOS}$ and PMOS transistors $I_{PMOS}$ may be substantially similar in both the first and second ring oscillators 126A, 156A relative to a wafer location where the transistors are formed. By employing oscillators 126A, 156A having similar components arranged in similar orientation, the first frequency f1 and the second frequency f2 may differ by approximately less than ten percent of an average value of the first and second frequencies f1, f2. In addition, the first semiconductor die 120 and the second semiconductor die 150 may be obtained from a common wafer using a semiconductor manufacturing process to eliminate inter-wafer variations. With farther testing and sorting, the variation between the first frequency f1 and the second frequency f2 may be kept below approximately less than five percent of an average value of the first and second frequencies f1, f2.

In the embodiment shown in FIG. 1A, the first and second frequencies f1, f2 that are packaged in a single isolation device 100 may be substantially similar. For example, the first and second frequencies f1, f2 of an isolation device 100 may differ from one another by approximately less than ten percent of an average value of the first and second frequencies f1, f2. However, the first and second frequencies f1, f2 of two different isolation devices 100 may differ from one another by approximately more than twenty percent of an average value of the first and second frequencies f1, f2.

The first and second oscillators 126, 156 may be standalone oscillators. The stand-alone oscillators 126A, 156A shown in FIG. 1B may be simple and may require relatively less die area. However, instead of the first oscillator 126 or the second oscillator 156, a more accurate and more sophisticated clock generator (not shown) such as a phase lock loop may be employed in other embodiments. The first and second oscillators 126, 156 may be configured to oscillate based on a common process parameter of the first and second semiconductor dies 120, 150. In the example shown in FIG. 1B and FIG. 1C, the first and second oscillators 126, 156 may be configured to oscillate based on a common process parameter to manufacture the NMOS and the PMOS transistor. E Examples of a common process parameter include, without limitation, threshold voltage, gate oxide thickness, saturation current for transistors, sheet resistance, capacitances between layers, breakdown voltages of transistors, beta of bipolar transistors and other parameters involved in manufacturing a semiconductor wafer.

The first semiconductor die 120 of the isolation device 100 may comprise an input terminal 137 configured to receive a first signal 191 that may be an analog or a digital signal. The first semiconductor die 120 of the isolation device 100 may comprise substantially a transmitter circuit 130 for transmitting a first signal 191 to the second semiconductor die 150. The second semiconductor die 150 of the isolation device 100 may comprise substantially a receiver circuit 160 for receiving the first signal 191 from the first semiconductor die 120. The first and second clock generators 122, 152 may form a portion of the transmitter circuit 130, and a portion of the receiver circuit 160 respectively in another embodiment.

The transmitter circuit 130 provided with the first semiconductor die 120 may be driven by the first clock signal 124 to transmit the first signal 191 from the first semiconductor die 120 to the second semiconductor die 150, whereas the receiver circuit 160 provided with the second semiconductor die 150 may be driven by the second clock signal 154 to receive the first signal 191 from the first semiconductor die 120. The transmitter circuit 130 that may operate in a lower frequency may be driven by a third clock signal 128 that may be divided down from the first clock signal 124.

In the embodiment shown in FIG. 1A, the transmitter circuit 130 may comprise a divider circuit 132 configured to divide the first clock signal 124 into a third clock signal 128 having a third frequency f3, lower than the first frequency f1. The divider circuit 132 may be configured to divide the first clock signal 124 in accordance to a digital signal 198 such as the first signal 191. For example, the divider circuit 132 may be configured to divide the first clock signal 124 into the third clock signal 128 having the third frequency f3 when the first signal 191 is in a first predetermined state, and configured to divide the first clock signal 124 into the third clock signal 128 having a fourth frequency f4 when the first signal 191 is in a second predetermined state. The second predetermined state may be different from the first predetermined state in a number of ways. For instance, the first predetermined state may correspond to one signal level (e.g., HIGH, logical '1', etc.) whereas the second predetermined state may correspond to a second signal level (e.g., LOW, logical '0', etc.). As another example, the first and second predetermined states may correspond to rising and falling edges of the first signal 191, respectively. Other predetermined states for the first signal 191 can also be envisioned.

On such occasion, the divider circuit 132 may operate as a modulator modulating the first signal 191 into the third clock signal 128. The divider circuit 132 may be configured to generate more than two different frequencies. For example, the first signal 191 may be a multi-bit digital signals or an analog signal that require many different frequencies with each frequency correspond to a state of the first signal 191.

In the embodiment shown in FIG. 1A, the transmitter circuit 130 may comprise a level shifter 134 coupled to the divider circuit 132, a periodic waveform generator 136 coupled to the level shifter 134, and a mixer 144 coupled to the periodic waveform generator 136. The first clock generator 122 and the divider circuit 132 may be a digital circuit having digital signals 124, 128 with a full voltage swing. The level shifter 134 may be configured to shift the voltage of the digital signals 124, 128 so as to obtain an output 129 having a voltage shifted from the full voltage swing. For example, in one embodiment, the output of the divider circuit 132 may be between −15V and 15V but the output 129 of the level shifter 134 may be between −5V and 5V.

The output 129 of the level shifter 134 may be coupled to a periodic waveform generator 136 to generate a periodic analog signal 131. The periodic analog signal 131 may comprise ramp signals having substantially triangular sawtooth waveform. However, the periodic analog signal 131 may be a sine-cosine signal in another embodiment. The mixer 144 may be configured to modulate the periodic analog signal 131 with an analog signal 199 into a modulated pulse signal 192. For example, the isolation device 100 may comprise an analog input terminal 135 configured to receive a second signal 195. The analog input terminal 135 may be coupled to the mixer 144. The mixer 144 may be configured to module the second signal 195 from the analog input terminal 135 into the modulated pulse signal 192 using a pulse with modulation scheme or a code division modulation scheme.

The modulated pulse signal 192 may be coupled to an emitter 142 so as to generate a radiation 190 across the isolation barrier 102. The radiation 190 may be a magnetic field, light, or electro-magnetic radiation without having a direct current between the first semiconductor die 120 and the second semiconductor die 150. The emitter 142 may be referred also as a transmitter 142. The isolation device 100 may be referred to as an opto-coupler if optical emitters are chosen. Similarly, the isolation device 100 may be referred to as a magnetic coupler if a magnetic emitter is selected.

As explained above, one, some, or all of the divider circuit 132, the level shifter 134, the periodic waveform generator 136 and the mixer 144 may be a portion of a modulator circuit 140 configured to modulate one or both the first and second signals 191, 195 into the modulated pulse signal 192. In another embodiment without the optional divider circuit 132, the level shifter 134 and the periodic waveform generator 136, the modulator circuit 140 may comprise the mixer 144 that is configured to modulate the first signal 191 into a modulated pulse signal 192 directly.

The first semiconductor die 120 comprises a virtual power node 139 and a power terminal 138. The power terminal 138 may be electrically coupled to a power supply 108, or a regulator circuit 104 for receiving electrical power from the power supply 108. Usually, the power terminal 138 may be configured to operate in a full voltage amplitude swing. The virtual power node 139 may be coupled to the power terminal 138 via at least one of a capacitor, a diode and an internal regulation circuit (not shown). The first clock generator 122 and the divider circuit 132 may be coupled to the power terminal 138. The level shifter 134, the periodic waveform generator 136 and the mixer 144 may be coupled to the virtual power node 139 instead of the power terminal 138.

As shown in FIG. 1A, the first clock signal 124 may have a first amplitude a1. The first amplitude a1 may be the full voltage swing of the power supply 108 or the regulator circuit 104. By way of the virtual power node 139, the periodic analog signal 131 may have a second amplitude a2 relatively smaller than the first amplitude a1. For example the first amplitude a1 may be 30V with a voltage signal amplitude between −15V to 15V whereas the second amplitude a2 may be 5V with a voltage signal amplitude between 0V to 5V. The smaller amplitude of second amplitude a2 may contribute towards lower power consumption of the isolation device 100. Similarly, the modulated pulse signal 192 may have smaller amplitude similar to the second amplitude a2.

The receiver circuit 160 of the second semiconductor die 150 may comprise a detector 162 for receiving the radiation 190 emitted from the emitter 142. The detector 162 may be configured to transform the radiation 190 into an electrical signal. For example, the detector 162 shown in FIG. 1A may be configured to receive the radiation 190 carrying the modulated pulse signal 192 emitted by the emitter 142 and in response thereto, generate a received modulated pulse signal 193 as output to the detector 162. The detector 162 may be a photo-detector, a magnetic field detector or capacitive plates for receiving capacitive signals.

The receiver circuit 160 may comprise a demodulator circuit 164 configured to demodulate the received modulated pulse signal 193 so as to reproduce the first signal 191 or the second signal 195 or both of the first and second signals 191, 195. The demodulator circuit 164 may generate a reproduced signal 194, as output to the demodulator circuit 164. The demodulator circuit 164 may correspond to an analog filtering circuit or mixer circuits adapted to demodulate the received modulated pulse signal 193.

Optionally, the isolation device 100 may comprise a counter 170 coupled to the detector 162. The counter 170 may be configured to count in accordance to a pulse length of the received modulated pulse signal 193 so as generate a count value 172 that may be recorded in a register. The isolation device 100 may further comprise a control circuit 180 configured to determine an indication of the first signal 191 by using the counter 170. The indication of the first signal 191 may be stored in a status register 182 or any other memory circuits.

During start-up condition where a power supply 108 to the second semiconductor die 150 starts to provide power, the detector 162, the demodulator circuit 164 and the counter 170 may not be in a condition suitable for operation. The second semiconductor die 150 may further comprise a start-up circuit 174 configured to generate a power up signal 196. The power up signal 196 may be coupled to the control circuit 180 as output to the start-up circuit 174.

The control circuit 180 may be configured to stop determining an indication of the first signal 191 when the power up signal 196 is activated. For example, the power up signal 196 may be selected to be in a digital LOW condition during operation but during power up, the power up signal 196 may be activated when the power up signal 196 is transitioned to a digital HIGH state. Other combinations or other means may be selected to activate the power up signal 196. For example, for a multi-bits power up signal 196, setting the power up signal 196 to a specific binary sequence may activate the power up signal 196. Alternatively, the power up signal 196 may be activated by going through a transition such as a positive edge, changing from a digital LOW state to a digital HIGH state. The activation process discussed here may be applicable to other subsequently discussed signals when the term "activated" or "triggered" is used.

Figure 1D:
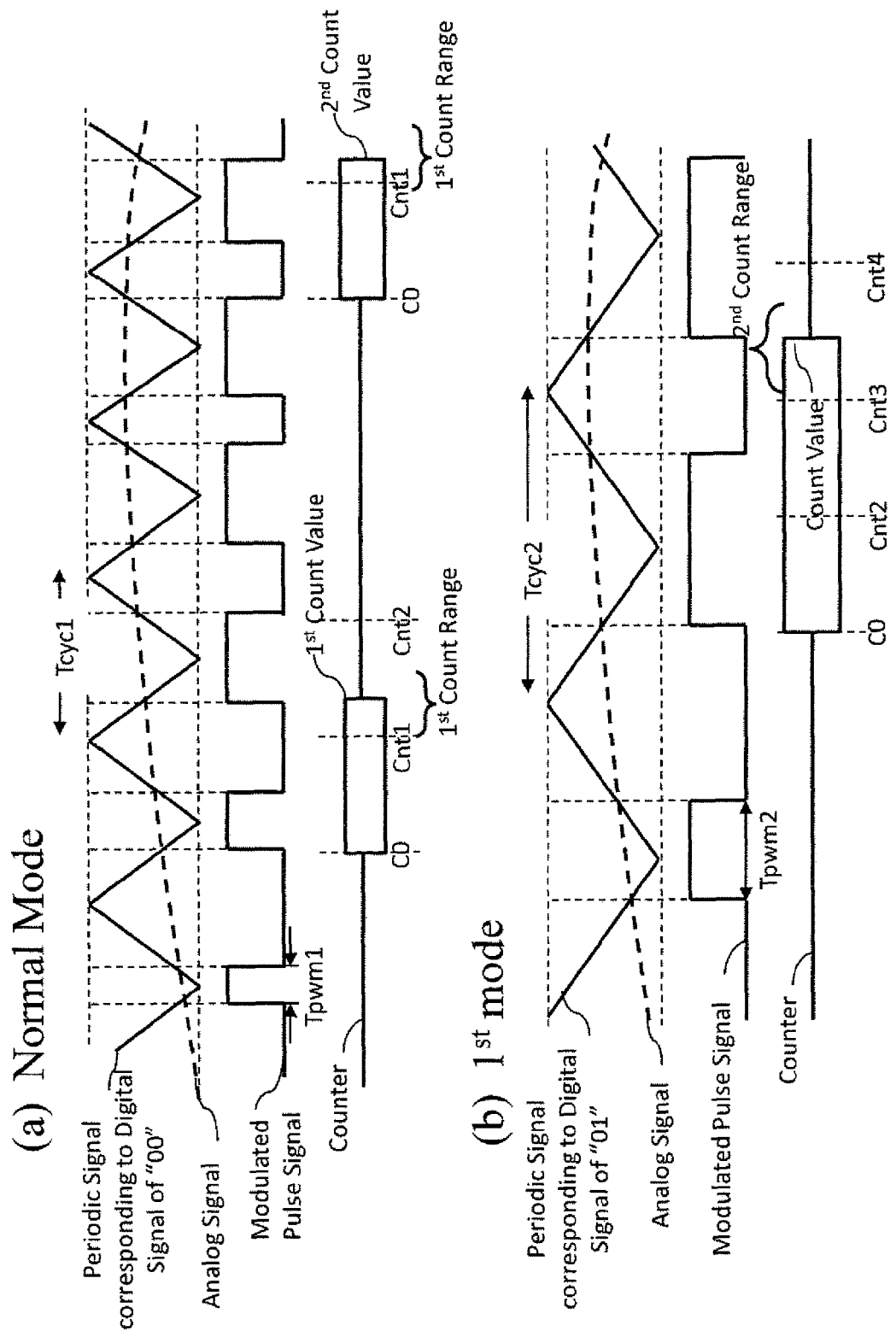
FIG. 1D shows a timing diagram illustrating how a counter of the isolation device works in a first mode as compared to a normal mode.
Figure 1E:
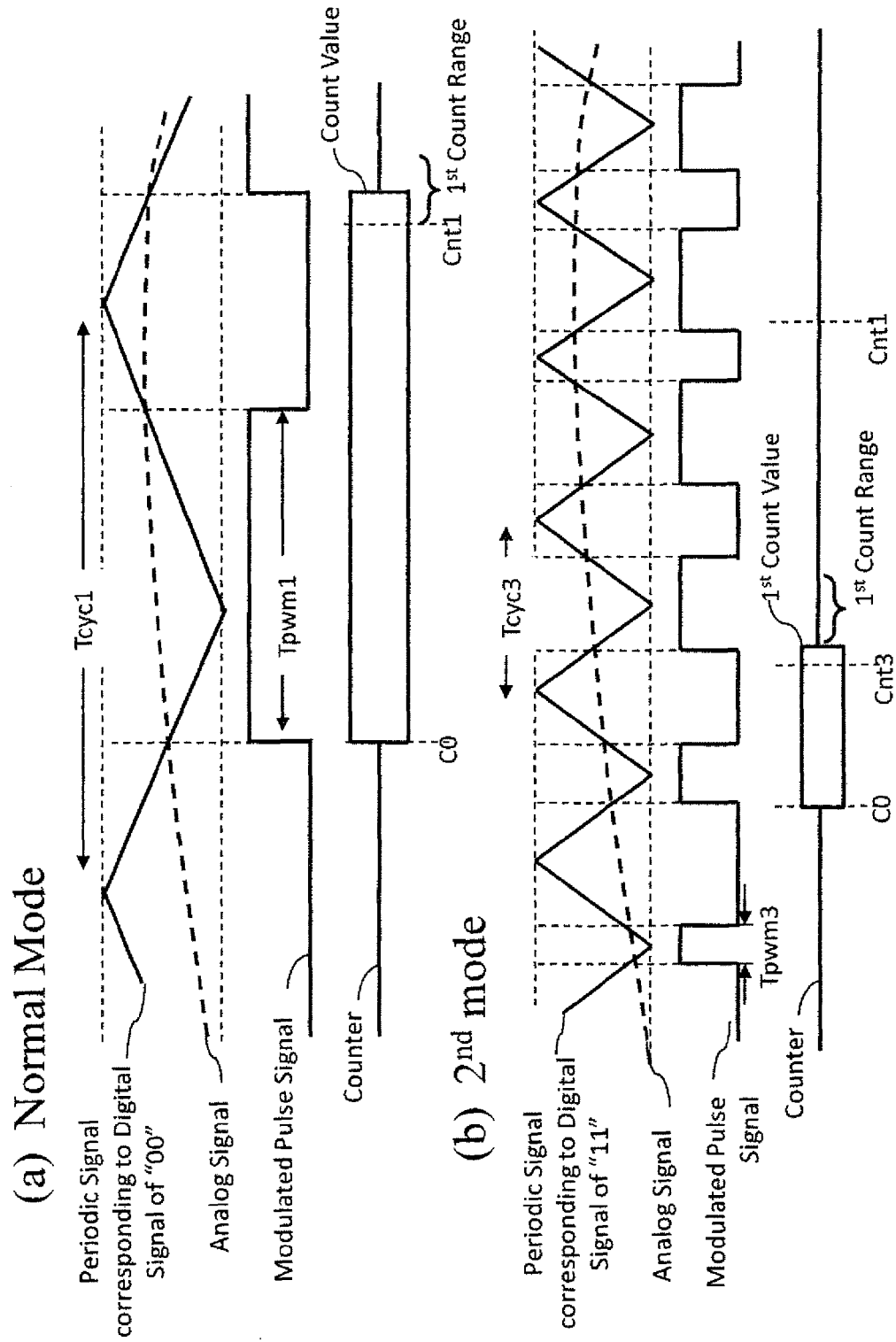
FIG. 1E shows a timing diagram illustrating how the counter of the isolation device works in a second mode as compared to the normal mode.
Figure 1F:
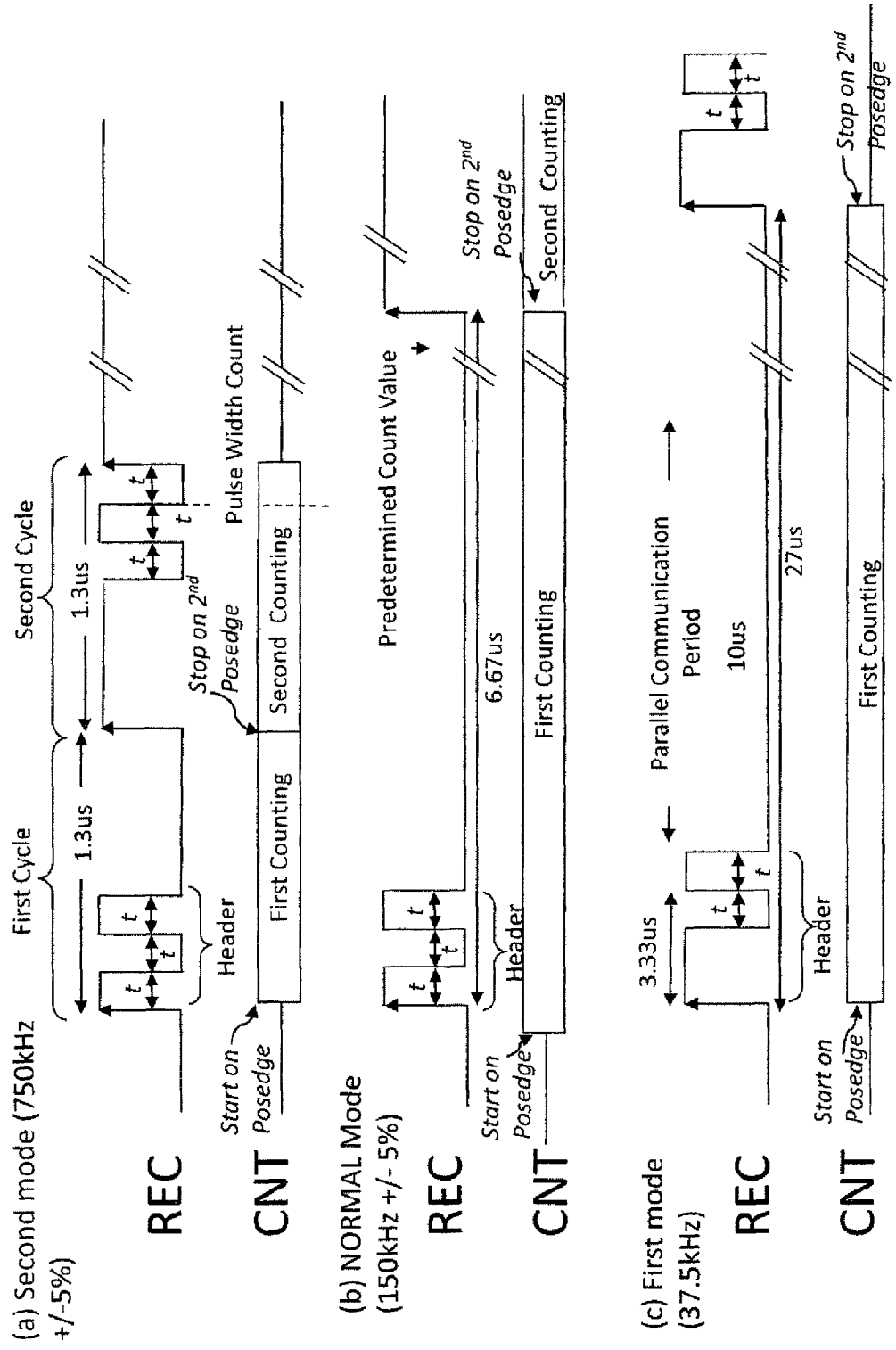
FIG. 1F shows an illustrative timing diagram comparing the normal mode, the first mode and the second mode.

The control circuit 180 may be configured to detect multiple modes of operation. Each mode of operation may correspond to an indication of the first signal 191. By way of monitoring the count value 172 of the counter 170, the control circuit 180 may be configured to detect a normal mode, a first mode and a second mode as illustrated in FIGS. 1D-1F. FIG. 1D shows a timing diagram illustrating how the counter 170 of the isolation device 100 works in a first mode as compared to a normal mode. The normal mode may be a default mode where all components operate under normal conditions. During normal mode, the control circuit 180 may be configured to monitor the first signal 191 continuously.

For example, when the digital state of the first signal 191 is in "00", the periodic analog signal 131 may have a time period Tcyc1 generated in accordance to the third frequency f3. The mixer 144 may modulate the periodic analog signal 131 with the second signal 195 or any other analog signal to obtain the modulated pulse signal 192. In this example where pulse width modulation scheme is employed, the modulated pulse signal 192 may have a pulse width Tpwm1 generated in accordance to the second signal 195. The modulation may be performed such that the ratio of the pulse width Tpwm1 to the time period Tcyc1 may represent the second signal 195.

In the first mode where the first signal 191 is in a digital state of "01" for example, the periodic analog signal 131 may have a time period Tcyc2 generated in accordance to the fourth frequency f4. The mixer 144 may modulate the periodic analog signal 131 with the second signal 195 to obtain the modulated pulse signal 192. The modulation of the second signal 195 may remain similar to the normal mode. The ratio of the pulse width Tpwm2 to the time period Tcyc2 may reflect substantially the second signal 195 in spite of the frequency change. The pulse width Tpwm2 may increase proportionally similar to the time period Tcyc2. The demodulator circuit 164 may be able to reproduce the second signal 195 by calculating the ratio of the pulse width Tpwm1 or Tpwm2 to the time period Tcyc1 or Tcyc2 respectively.

The demodulator circuit 164 may utilize one or more analog filters to reproduce the first signal 191. However, the counter 170 may be configured to determine an indication of the first signal 191 without the use of analog filters. For example, the difference between the normal mode and the first mode may be that the frequency of the periodic analog signal 131 has changed. Although not precise, the counting of the time period Tcyc1, Tcyc2 may enable the control circuit 180 to determined an indication of the first signal 191 through the recorded count value 172. The counting of the time period is explained in further detail herein.

The counter 170 may be activated and start counting when the received modulated pulse signal 192 is in a first predetermined condition. The first predetermined condition may be similar to the first predetermined state discuss earlier. Optionally, the first predetermined condition may be made different such as having to detect specific header patterns. The counter 170 may be configured to stop counting or to record a first count value when the received modulated pulse signal 193 is in a second predetermined state. For example, the counter 170 may be configured to start counting at the positive edge of the modulated pulse signal 192, and may be configured to record a count value 172 in the next positive edge of the modulated pulse signal 192 as shown in FIG. 1D. In other words, the first predetermined state may be the first positive edge of the modulated pulse signal 192 and the second predetermined state may be the next positive edge in the example discussed above.

The counter 170 may be configured to record the count value 172 in a third predetermined state so as to record down a pulse width count value. The pulse width count value may be representative of the pulse width Tpwm1, Tpwm2. However, the pulse width count value may be compared to the recorded count value to determine an approximation of the analog signal by computing the ratio of the pulse width Tpwm1, Tpwm2 to the time period Tcyc1, Tcyc2. The computation may not be as precise but merely a coarse estimation that give an indication of the second signal 195. A higher frequency clock in counting may improve the accuracy but at the expense of larger die size.

Although the recorded count value may not reflect the time period Tcyc1 or Tcyc2 precisely, the recorded count value may be sufficient to determine an indication of the first signal 191 if the third frequency f3 and the fourth frequency f4 are selected in a right ratio. For example, the third frequency f3 and the fourth frequency f4 may be selected such that the third frequency is at least two times or three times the fourth frequency. Accordingly, the recorded count value of the two modes may be substantially different. Hence, even with counting errors and variation, the indication of the first signal 191 may be sufficiently accurate.

The control circuit 180 may be configured to detect the normal mode if the recorded count value 172 is within a first count range exceeding a first predetermined count value Cnt1. However, if the recorded count value 172 is within a second count range exceeding the second predetermined count value Cnt2, the control circuit 180 may be configured to detect a first mode. The second predetermined count value Cnt2 may be at least two times the first predetermined count value Cnt1. In another embodiment where manufacturing process variation are larger, the second predetermined count value Cnt2 may be selected to be at least three times the first predetermined count value Cnt1 depending on the relationship between the third frequency f3 and the fourth frequency f4. Similarly, the second count range may be at least two times the first count range. In another embodiment, the first count range and the second count range may be substantially similar.

FIG. 1E shows a timing diagram illustrating how the counter 170 of the isolation device 100 works in a second mode as compared to the normal mode. FIG. 1E and FIG. 1D are drawn in a different scale. As shown in FIG. 1E, in the second mode where the first signal 191 is in a digital state of "11", for example, the periodic analog signal 131 may have a time period Tcyc3 generated in accordance to a fifth frequency f5. The modulated pulse signal 192 may have a pulse width Tpwm3 generated in accordance to the second signal 195. The ratio of the pulse width Tpwm3 to the time period Tcyc3 may reflect the second signal 195. The pulse width Tpwm3 may decrease proportionally similar to the time period Tcyc3.

As shown in FIG. 1E, the control circuit 180 may be configured to detect the second mode if the recorded count value 172 is within a third count range exceeding a third predetermined count value Cnt3. The third predetermined count value Cnt3 may be less than approximately half of the first predetermined count value Cnt1. However, another embodiment, the third predetermined count value Cnt3 may be less than approximately one third of the first predetermined count value Cnt1. The third count range may be less than half of the first count range in a similar manner to the relation between the third frequency f3 and the fifth frequency f5, but the first count range and the third count range may be substantially similar in another embodiment.

Activating the counter 170 may be done through a specific sequence depending on the operating mode. In addition, the process of counting may differ in different operating modes. An example may be shown in FIG. 1F. FIG. 1F shows an illustrative timing diagram comparing the normal mode, the first mode and the second mode. The received modulated pulse signal 192 is labeled as "REC" whereas the output of the counter 170 is labeled as "CNT" in FIG. 1F. In the example shown in FIG. 1F, the counter 170 may be activated through a positive edge of the received modulated pulse signal 193 or a starting sequence. The starting sequence may differ for different modes. For example, in the normal mode and the second mode, the starting sequence may be a HIGH, LOW, HIGH for a specific time period t. This may prevent mis-triggering of the counter 170 as the counter 170 may stop counting if the starting sequence is not detected.

For the first mode where the frequency is low, a higher count will be expected and the communication between the first and second semiconductor dies 120, 150 may take a long time. In the example shown in FIG. 1F, the time period for the normal mode may be 6.7 us but the time period for the second mode may be 27 us. In other words, a much longer communication time may be required.

The starting sequence in the second mode may be made different in order to utilize the communication channel for operating modes that require longer communication time. For example, upon receiving such starting sequence, the control circuit 180 may be configured to monitor the received modulated pulse signal 193 for a parallel communication time period such as 10 us. During the monitoring period, other information may be transmitted. With this, communication rate in the first mode may be improved. In addition to additional communication time, the parallel communication time period may be made available for fault tolerance checking sequence in a higher noise environment.

As shown in the example illustrated in FIG. 1F, in the normal mode, the counter 170 may be configured to continue counting after the first counting ends. In contrast, the counting may be performed for one cycle for frequency detection in the first mode and the second mode. In the first mode, after the first cycle, the counting may be performed to detect the pulse width instead of counting the entire time period. The counting may continue at a time interval. For example, after a first counting session, the subsequence counting session may continue after a time interval in the normal mode.

In the embodiment shown in FIG. 1F, the received modulated pulse signal 193 may be modulated in the normal mode using the third frequency f3 of approximately 150 kHz. The frequency selected for the first mode may be 37.5 kHz whereas the frequency selected for the second mode may be 750 kHz. The frequency may have variation of plus or minus five percent. Therefore, the time cycle and the time period may be selected corresponding to the selected frequency. For example, the time period for the normal mode, the first mode and the second mode may be approximately 6.7 us, 27 us and 1.3 us respectively. Note that the time period selected may correspond to the frequencies selected, but may not be precisely correspond to the frequencies selected. For example, the time period selected for the normal mode may be 6us instead of 6.7 us.

Figure 1G:
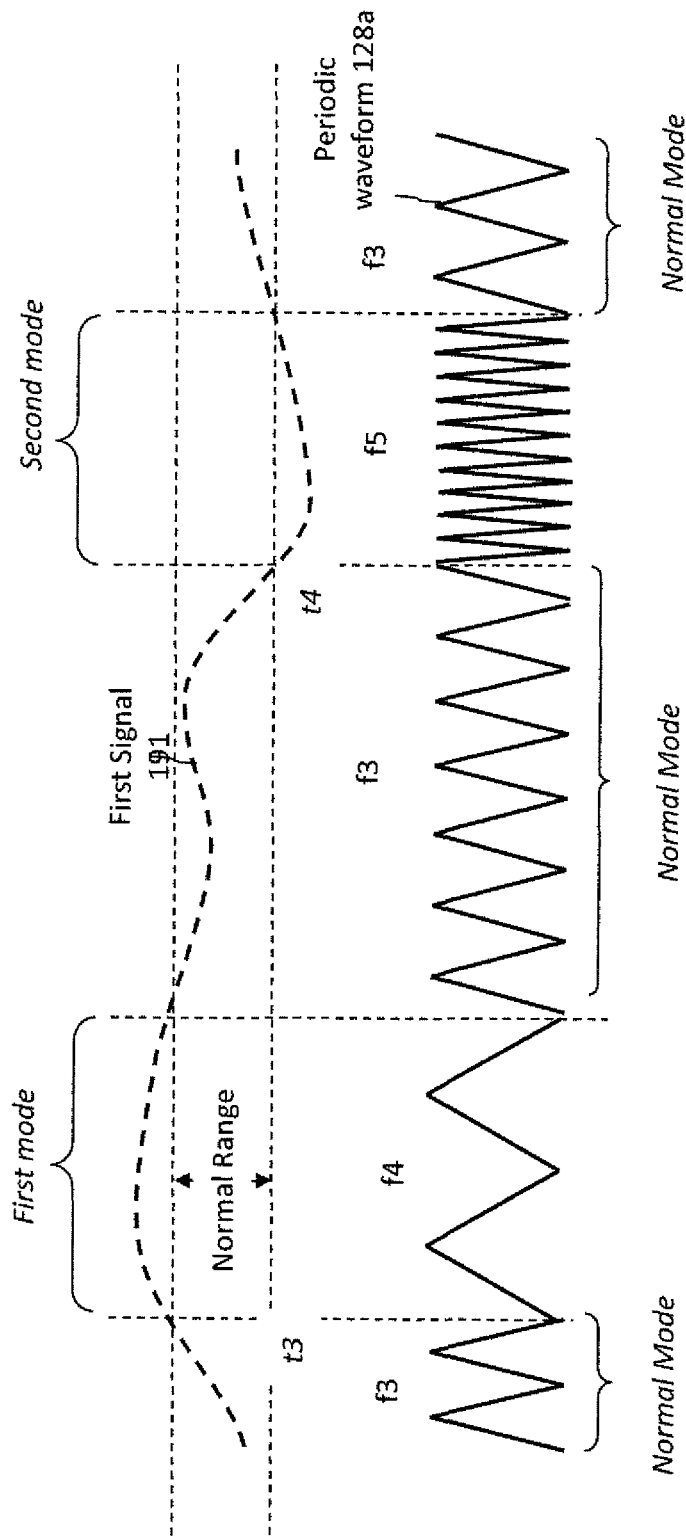
FIG. 1G shows an illustrative timing diagram demonstrating how the isolation device controls the first signal to be within a predetermined range.

The counting pattern, the counting sequence, and the manner of counting may be used in any combinations to implement a feedback control system. FIG. 1G shows an illustrative timing diagram demonstrating how the isolation device 100 controls the first signal 191 to be within a predetermined range. The first signal 191 in the example shown in FIG. 1G may be voltage output of a voltage regulation system using a transformer. The control circuit 180 and the counter 170 may be configured to detect an indication as to whether the first signal 191 is within the predetermined range.

Referring to FIG. 1D, FIG. 1E and FIG. 1G, under the normal mode, the recorded may be within a first predetermined range from the first predetermined count value Cnt1. However, for example, when the first signal 191 exceeds the predetermined range at t3, the frequency of the waveform signal 128a may decrease from the third frequency f3 to the fourth frequency f4. As a result, the recorded count value may be within a second count range exceeding the second predetermined count value Cnt2. Recall that the second predetermined count value Cnt2 is substantially larger than the first predetermined count value Cnt1. In respond, the control circuit 180 may detect the changes and operates in the first mode instead of the normal mode. In the first mode, the control circuit 180 may be configured to control the isolation device 100 such that the first signal 191 is restored to the predetermined range. As shown in FIG. 1G, when the first signal 191 is back to the predetermined range, the control circuit 180 may operate in normal mode again and the frequency of the periodic waveform 128a may be restored back to the third frequency f3.

When the first signal 191 drops below the predetermined range at t4, the frequency of the waveform signal 128a may increase from the third frequency f3 to the fifth frequency f5. As a result, the recorded count value 172 may be within a third count range exceeding the third predetermined value Cnt3. Recall that the third predetermined value Cnt3 may be substantially smaller than the first predetermined count value Cnt1. In respond, the control circuit 180 may detect the changes and may operate in the second mode instead of the normal mode. In the second mode, the control circuit 180 may be configured to control the isolation device 100 such that the first signal 191 is restored to the predetermined range. As shown in FIG. 1G, when the first signal 191 is back to the predetermined range, the control circuit 180 may operate in the normal mode again. In the normal mode, the frequency of the periodic waveform may be restored back to the third frequency f3.

The frequency used for modulation performed in the divider circuit 132 and the periodic waveform generator 136 may be selected from lower frequencies range such as below 1 MHz. Additional communication between the first semiconductor die 120 and the second semiconductor die 150 may be performed using a higher frequency band such as few MHz or higher. An example may be shown in FIG. 1H in which "awake pulses" may be communicated using higher frequency. The "awake pulses" may be transmitted over from the first semiconductor die 120 to the second semiconductor die 150 as an indication that the first semiconductor die 150 is still in operation. The "awake pulses" may be a single pulse, or a series of specific pulse patterns or any other forms that have a relatively short pulse width e.g., less than approximately 70 ns.

Figure 1H:
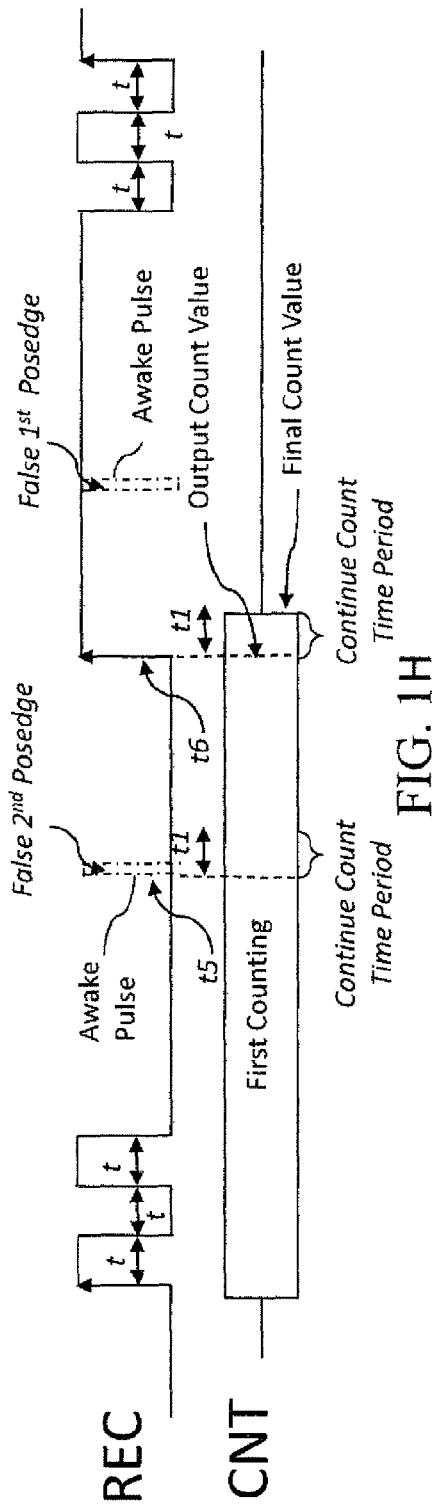
FIG. 1H shows a timing diagram illustrating how the counter respond to an awake pulse.

In the example shown in FIG. 1H, the pulse width for the specific header pattern for communications of the first signal 191 may be minimally the specific time period t, and the "awake pulses" utilizing higher frequency may have pulse width lower than half or one third of the specific time period t. For example, the specific time period t used as header patterns may be 160 ns whereas the "awake pulses" may be less than 70 ns.

Recall that the counter 170 may be configured to start counting when the received modulated pulse signal 193 transitions from a first predetermined state to a second predetermined state, such as a transition from a digital LOW to a digital HIGH on a positive edge. The "awake pulses" may fulfill the stop condition and therefore, in order to accommodate the additional functionality of awake pulses, the counter 170 may be configured to count for a first predetermined time period after the received modulated pulse signal 193 is configured to transition from the first predetermined state to the second predetermined state to monitor the received modulated pulse signal 192.

In FIG. 1H, the first predetermined time period is indicated by label t1. For example, as shown in FIG. 1H, if the received modulated pulse signal 193 transitions from the second predetermined state to the first predetermined state, such as "HIGH" to "LOW" in FIG. 1H during the first predetermined time period t1, the counter 170 may configured to continue counting. This example is shown near the timing t5 in FIG. 1H. The control circuit 180 may be configured to detect such short pulses to detect the additional signals such as the "awake pulses" after t5. If the received modulated pulses signal 193 do not transition from "HIGH" to "LOW" during the first predetermined time period t1, the counter 170 may store a recorded count value, recorded during the transition of the received modulated pulse signal 192, as a final count value to the status register 182 and stop counting. This example is shown near the timing t6 in FIG. 1H. In the example shown in FIG. 1H, the first predetermined time period a may be more than the specific time period t.

The isolation device 100 may form a portion of a feedback control system 110. The feedback control system 110 may be any system providing a feedback via the isolation device 100 across the isolation barrier 102. The system may generate a first signal 191 and/or the second signal 195 to be feedback through the isolation barrier 102 from the first semiconductor die 120 to the second semiconductor die 150. One example of such feedback control system 110 illustrated in FIG. 1A may be a direct current to direct current (DC-DC) feedback regulation system 110.

As shown in FIG. 1A, the DC-DC feedback regulation system 110 comprises a power supply 108, a first power monitor circuit 109, a power controller 106, a power transformer 105, a regulator circuit 104 and a second power monitor circuit 103. The power supply 108 may be configured to supply power to the regulator circuit 104 via the power transformer 105. The power transformer 105 may be arranged to supply power while electrically isolating the regulator circuit 104 from the power controller 106 and the power supply 108.

The first semiconductor die 120 may comprise a first power source terminal 138 coupled to the regulator circuit 104. The second semiconductor die 150 may comprise a second power source terminal 168 configured to be coupled to directly to the power supply 108, or indirectly to the power supply 108 through the power controller 106 having power regulatory circuit (not shown). The first power source terminal 138 may be coupled indirectly to the power supply 108 through the power transformer 105 such that the first power source terminal 138, as well as the first semiconductor die 120, may draw power from the power supply 108 without a direct electrical current path.

The DC-DC feedback regulation system 110 may be controlled such that the first power source terminal 138 and the first semiconductor die 120 operate at a first voltage. As the power to the first power source terminal 138 and the first semiconductor die 120 may originate from the power supply 108 electrically isolated from the first power source terminal 138 and the first semiconductor die 120, the first voltage may be feedback through the isolation device 100 across the isolation barrier 102. For example, the second signal 195 may be a regulated voltage signal indicative of the first voltage. The modulator circuit 140 of the first semiconductor die 120 may be configured to modulate the second signal 195 the modulated pulse signal 192 so as to be feedback via the receiver circuit 160 of the second semiconductor die 150.

Similarly, other digital feedback signals such as fault signals or other signals indicative of the second power monitor circuit 103 may be feedback via the first signal 191. For example, the divider circuit 132 of the first semiconductor die 120 may be configured to divide down the first clock signal 124 in accordance to the first signal 191 into the third clock signal 128. The modulation circuit 140 may comprise the divider circuit 132 configured to modulate the first signal 191, and the mixer 144 configured to modulate the second signal 195. As a result, the modulated pulse signal 192 may comprise a plurality of signals such as the first and second signals 191, 195. The emitter 142 may be configured to transmit the modulated pulse signal 192 to the second semiconductor die 150.

As shown in FIG. 1A, the detector 162 of the second semiconductor die 150 may be configured to receive the modulated pulse signal 192, whereas the demodulator circuit 164 may be driven by the second clock signal 154 so as to reproduce the second signal 195 into a reproduced signal 194. The power controller 106 may be configured to control the power transformer 105 by way of providing the reproduced signal 194 as feedback.

Just as any power supplies, the power supply 108 may not be operating under a fixed voltage but may fluctuate within a range. On occasion where the power supply 108 drops below the fixed range, the control circuit 180 of the second semiconductor die 150 may be configured to disregard the fault signals transmitted from the first semiconductor die 120. The first power monitor circuit 109 of the DC-DC feedback regulation system 110 may be configured to generate a voltage range signal 197 that is indicative of whether the power supply 108 is in a predetermined range. In addition to the start-up circuit 174, the second semiconductor die 150 may comprise a fault detection circuit 176 configured to determine a faulty condition of the first semiconductor die 120.

Figure 1I:
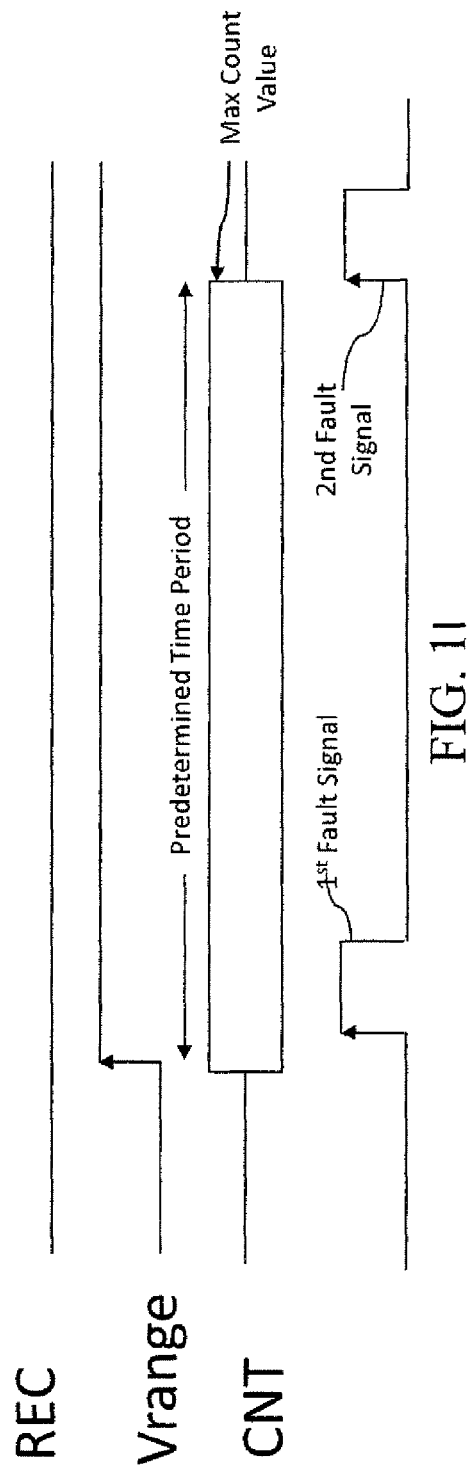
FIG. 1I shows a timing diagram illustrating how the counter respond to a voltage range signal.

FIG. 1I shows a timing diagram illustrating how the counter 170 and the fault detection circuit 176 respond to a voltage range signal 197. When the power supply 108 is providing a voltage outside the predetermined range, the voltage range signal 197 (labeled as "Vrange") may be activated, for example, into a logic "HIGH" status. Typically, the receiver circuit 160 may receive signals through the received modulated pulse signal 193 (labeled as "REC"). However, under certain faulty condition where the first semiconductor die 120 requires more time to stabilize the transformed voltages, and as a result, the received modulated pulse signal 193 may not be received. In such condition, the fault detection circuit 176 may be configured to generate a first fault signal 188 as illustrated in FIG. 1I. In other words, the fault detection circuit 176 may be configured to generate the first fault signal 188 if the detector 162 fails to receive the received modulated pulse signal 193 when the voltage range signal 197 indicates that the voltage of the power supply 108 is in the predetermined range.

In the event that the first semiconductor die 120 completely fails and not able to be regulated the transformed voltage to the required specification, no signals may be detected even after a longer wait. Therefore, after a second predetermined time period that may be corresponding to maximum count value of the counter 170, the first semiconductor die 120 may have to be shutdown. One way to execute the power down may be through a series of control sequences using the control circuit 180. For example, when the control circuit 180 detects the first fault signal 188, the counter 170 may be initiated to start counting. The fault detection circuit 176 may be configured to generate a second fault signal 189 if the detector 162 fails to detect the received the modulated pulse signal 193 for a second predetermined time period after the voltage range signal 197 is triggered. When the second fault signal 189 is triggered, the power controller 106 may cut off the power supply to the first semiconductor die 120.

Figure 2A:
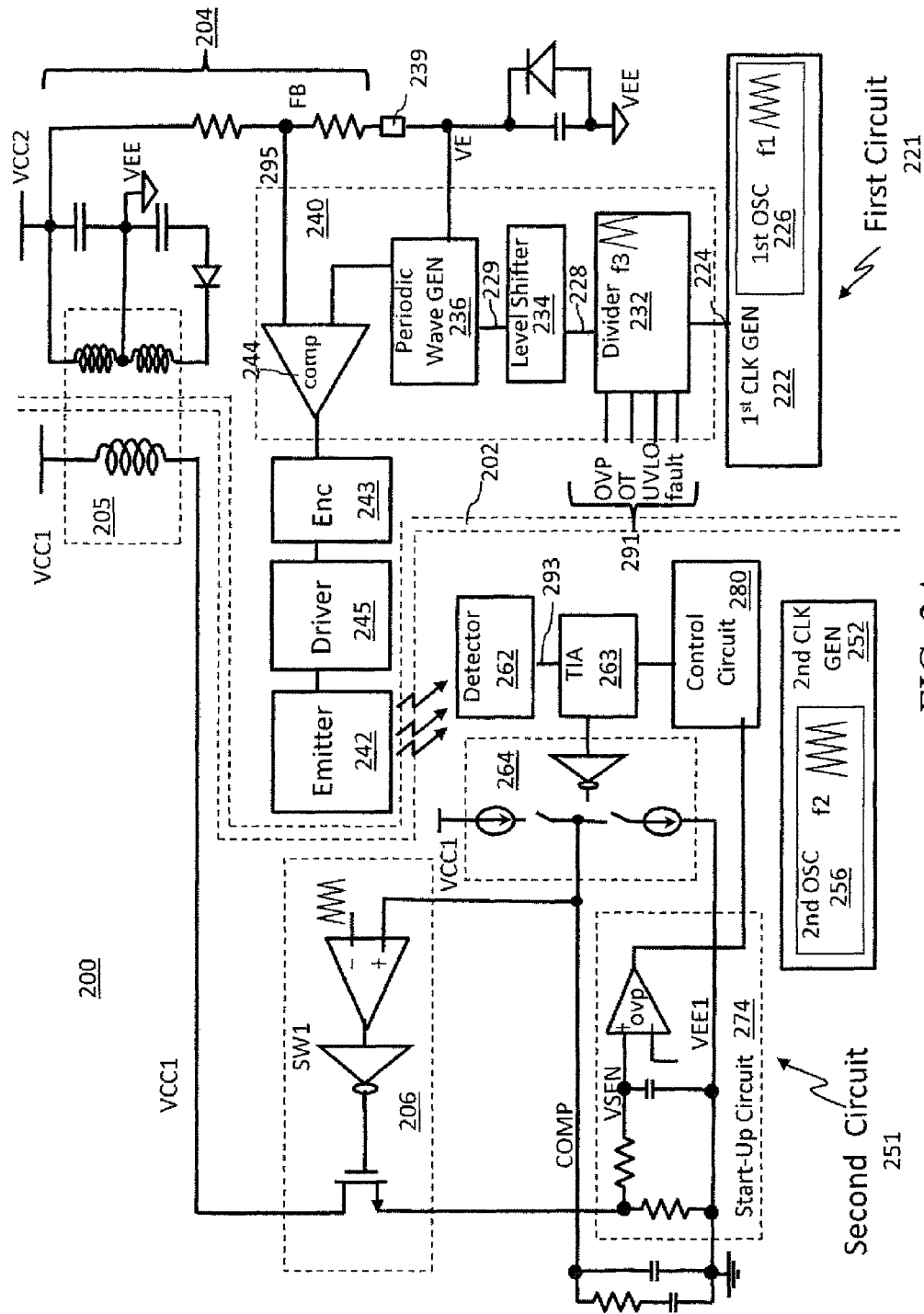
FIG. 2A illustrates a block diagram of an isolation device for a power regulation application.

FIG. 2A illustrates a block diagram of an isolation device 200 used in a power regulation application. The isolation device 200 may comprise a power transformer 205 for supplying voltage to a first circuit 221 that is electrically isolated from a second circuit 251. The first and second circuits 221, 251 may be isolated through an isolation material 202 but the first and second circuits 221, 251 may be located in close proximity such that communication between the two circuits may be performed by means of electric field signal, magnetic signals, light signals or any other invisible electro-magnetic wave signals without full radio frequency circuitry meant for long distance wireless communication devices.

The first circuit 221 may comprise a regulator circuit 204 configured to regulate the transformed power supply into a voltage level suitable for operation of the first circuit 221. Other conditions of the regulation such as over temperature ("OT"), over voltage ("OV"), fault conditions may be indicated as a first signal 291. The voltage level may be indicated in a second signal 295. The first circuit 221 may comprise a first clock generator 222, a first oscillator 226, a clock divider 232, a level shifter 234, a periodic waveform generator 236, a mixer 244, an encoder circuit 243, a driver 245 and an emitter 242 for transmitting the first signal 291 and the second signal 295 as feedbacks to the second circuit 251. As explained earlier, the clock divider 232, the level shifter 234, the periodic waveform generator 236 and the mixer 244 may be a portion of the modulation circuit 240 for modulating the first and second signals 291, 295 into a periodic pulse signals.

Figure 2B:
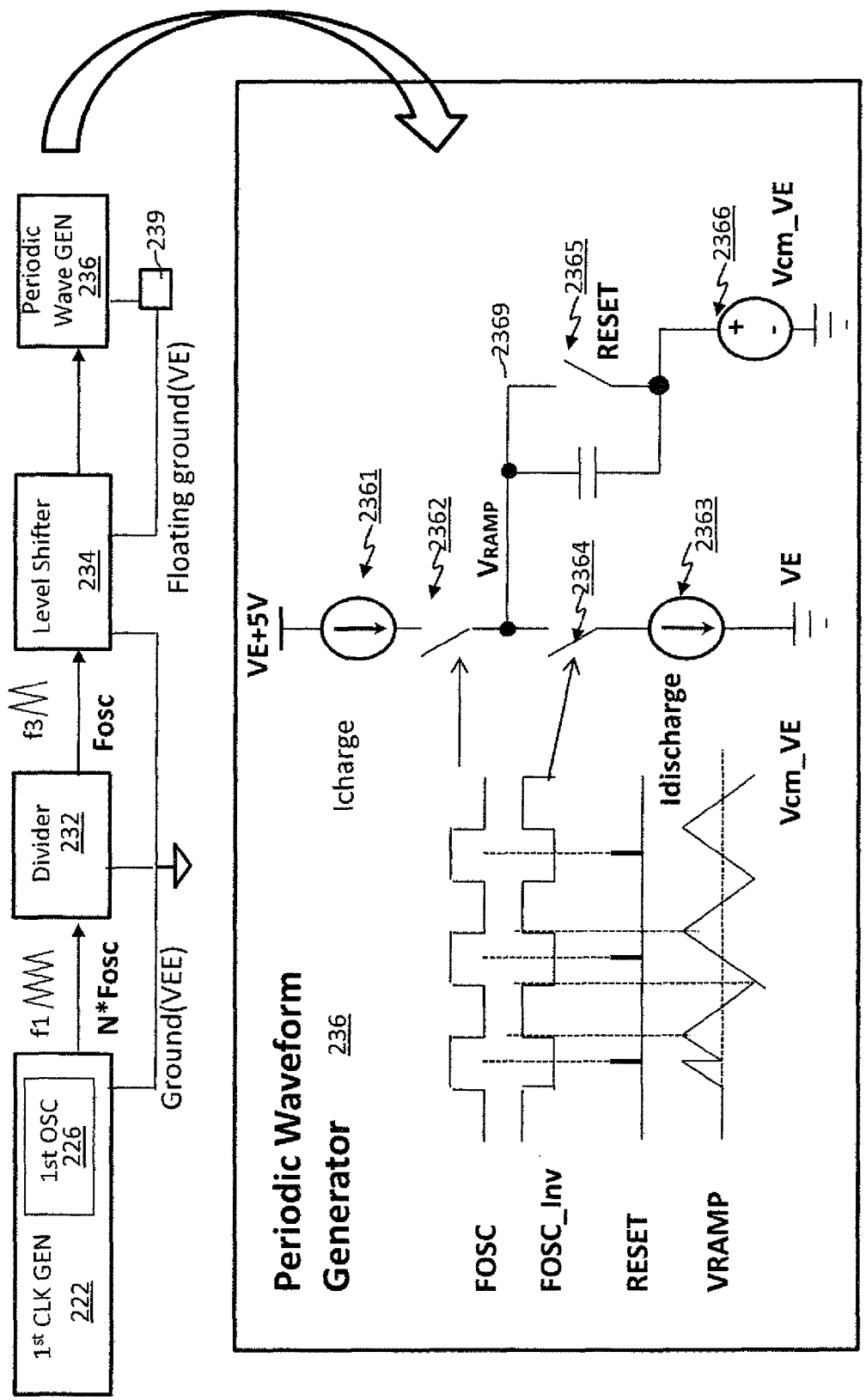
FIG. 2B shows an illustrative diagram showing how a clock signal is utilized to generate a periodic waveform in the DC-DC converter system shown in FIG. 2A.

The first clock generator 222, the first oscillator 226, the clock divider 232, the level shifter 234, and the periodic waveform generator 236 are illustrated in further details in FIG. 2B. The encoder circuit 243 may be configured to encode the modulated signal prior to being transmitted through the emitter 242. The driver 245 may be configured to drive the emitter 242. FIG. 2B shows an illustrative diagram showing how a clock signal is utilized to generate the periodic waveform generator 236 shown in FIG. 2A. The first oscillator 226 of the first clock generator 222 may be configured to generate a clock frequency having a first frequency f1, that may be N times the operating frequency, Fosc of the first circuit 221. As shown in FIG. 2B, the clock divider 232 may be configured to step down the first frequency f1 into a third clock signal 228 in accordance to the first signal 291. The third clock signal 228 may have the operating frequency Fosc that may be dependent on the state of the first signal 291. The operating frequency Fosc may be substantially lower than the first frequency f1. The operating frequency Fosc chosen may be similar to the example shown in FIG. 1D and FIG. 1E.

The clock divider 232 and the first clock generator 222 may be coupled to a terminal connected to Ground, shown as VEE in FIG. 2B. However, the level shifter 234 and the periodic waveform generator 236 may be coupled to a virtual Ground node 239, labeled as VE in FIG. 2B. By having different grounds, the voltage swing in the level shifter 234 and the periodic waveform generator 236 may be reduced to achieve lower power consumption.

As shown in FIG. 2B, the periodic waveform generator 236 may comprise a charging switch 2362 and a discharging switch 2364 coupled to an output terminal 2369. The charging switch 2362 and the discharging switch 2364 may be coupled respectively a charging current source 2361 and a discharging current source 2363. Each of the charging current source 2361 and the discharging current source 2363 may be a transistor biased to provide a constant. In addition, the charging switch 2362 and the discharging switch 2364 may be coupled to the third clock signal 228 so as to produce a triangular waveform signal. The triangular waveform signal may be referred as a ramp signal.

In addition, the periodic waveform generator 236 may further comprise a reset switch 2365 and a common mode voltage source 2366. The common mode voltage source 2366 may be a reference voltage generator configured to generate a common voltage for the triangular waveform signal, Vramp. As shown in FIG. 2B, the reset switch 2365 may be turned on periodically so that the output terminal 2369 may have the common mode voltage.

Referring to FIG. 2A, the second circuit 251 may comprise a detector 262, a trans-impedance amplifier 263, a control circuit 280, a demodulator 264, a second clock generator 256, a second oscillator 252, a start-up circuit 274. The output of the demodulator 264 may be coupled to a power controller 206 that may be coupled to the power transformer 205.

The detector 262 and the control circuit 280 may be driven by a second clock signal having a second frequency f2 substantially similar to the first frequency f1 for receiving the signal transmitted from the emitter 242. Optionally, the second circuit 251 may further comprise a counter (not shown) to determine an indication of the first signal 291. The start-up circuit 274 may comprise an R-C circuit that is configured to generate a power-up signal. During power up, the control circuit 280 may disregard the signal received from the emitter 242.

Figure 3A:
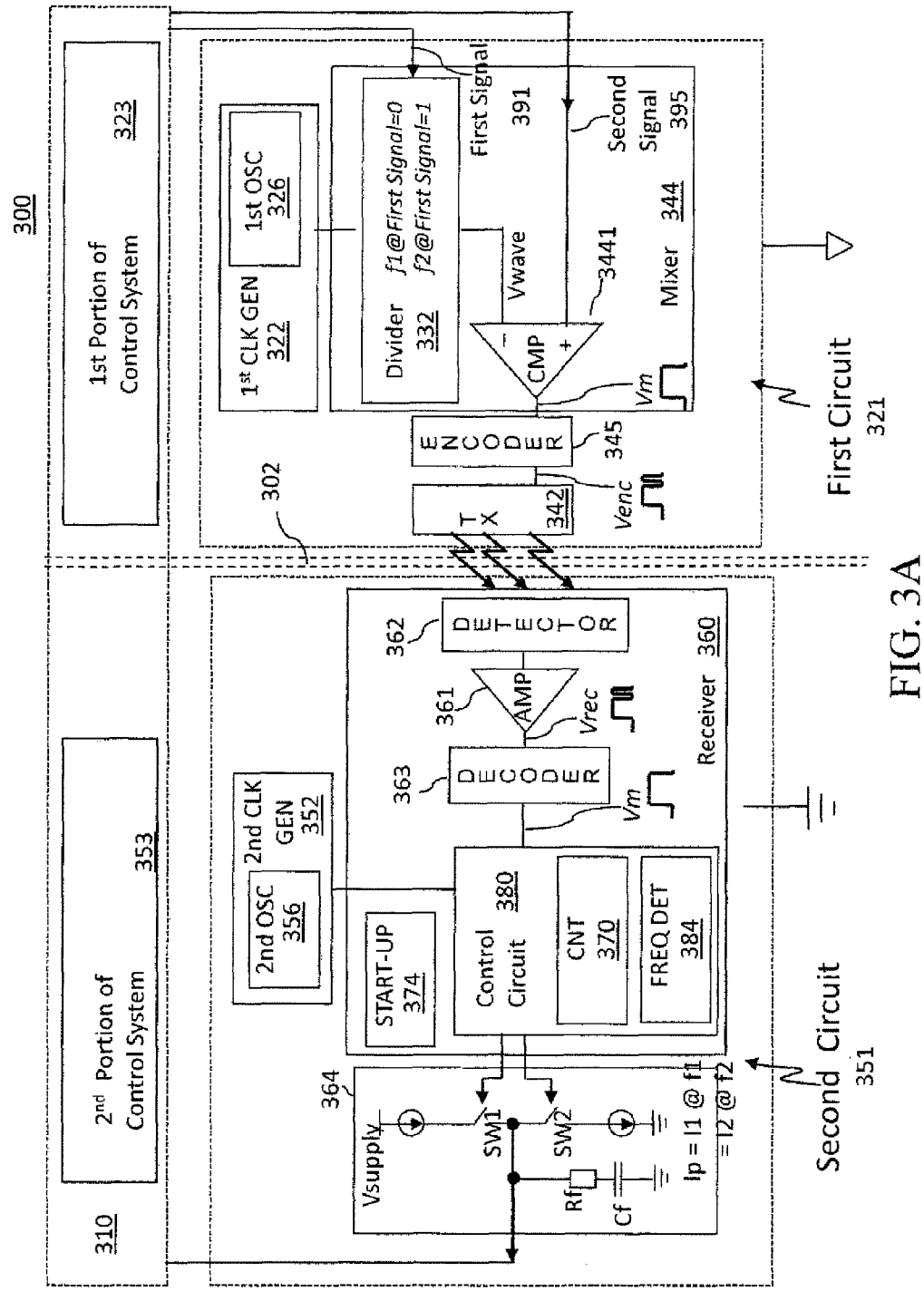
FIG. 3A illustrates a block diagram of an isolation system.

FIG. 3A illustrates a block diagram of an isolation system 300. The isolation system 300 may be configured to isolate a first circuit 321 from a second circuit 351 with an isolation barrier 302. The isolation system 300 comprise a control system 310 having a first portion 323 electrically coupled to the first circuit 321 and a second portion 353 electrically coupled to the second circuit 351. The isolation system 300 may further comprise a first clock generator 322, a mixer 344, a transmitter 342, a receiver 360, a second clock generator 352, a control circuit 380 and a demodulator 364.

The first clock generator 322 may be provided with the first circuit 321 to generate a first clock signal having a first predetermined frequency. A clock divider 332 that may be provided with the mixer 344 may be configured to step down the first predetermined oscillating frequency into the first clock signal having a frequency lower than the first predetermined oscillating frequency. In addition, the clock divider 332 may be configured to step down the first predetermined oscillating frequency in accordance to a first signal 391 that may be a control signal generated from the first portion 323 of the control system 310. Specifically, the clock divider 332 may be configured to step down the first predetermined oscillating frequency into a first frequency when the control signal is in a first predetermined state and configured to step down the first predetermined oscillating frequency into a second frequency substantially larger than the first frequency when the control signal is in a second predetermined state.

The mixer 344 may be configured to modulate the first signal 391 using the first clock signal into a modulated signal Vm. In addition, the mixer 344 may be configured to modulate additional signals such as a second signal 395. For example, the first signal 391 may be modulated by way of the clock divider 332 into a wave signal Vwave. The mixer 344 may further comprise a comparator 3441 configured to modulate a second signal 395 with the wave signal Vwave into the modulated signal Vm.

The transmitter 342 may be configured to transmit the modulated signal Vm from the first circuit 321 to the second circuit 351 across the isolation barrier 302. However, in order to increase accuracy of the transmission, the modulated signal Vm may be encoded through an encoder 345 prior to being transmitted through the transmitter 342. Examples of encoded signals are shown in FIG. 3B and FIG. 3C.

Figure 3B:
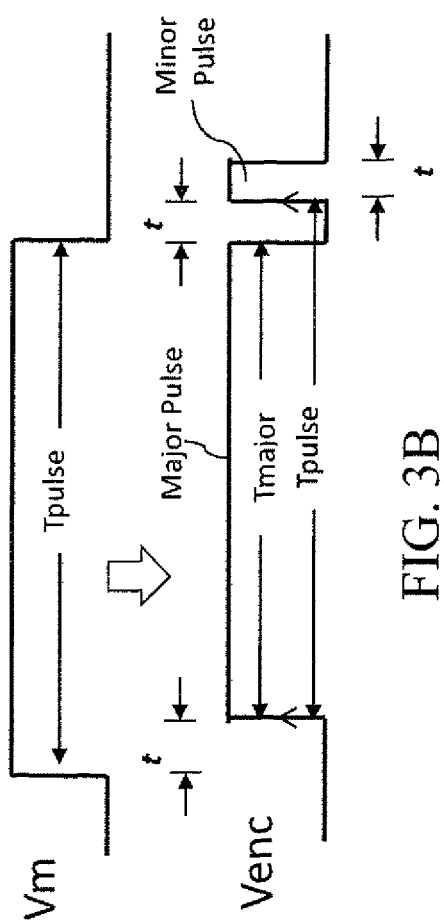
FIG. 3B illustrates an encoded modulated signal.
Figure 3C:
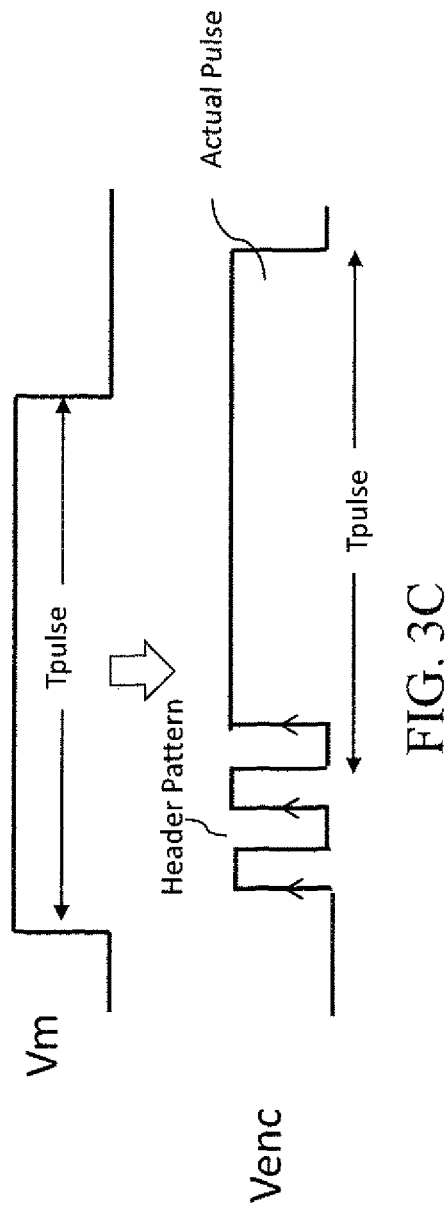
FIG. 3C illustrates an additional encoded modulated signal.

FIG. 3B illustrates an encoded signal Venc. The modulated signal Vm may have a pulse width of Tpulse. The encoded signal Venc may have a major pulse with a pulse width of Tmajor and a minor pulse. The major pulse may be delayed by a predetermined minimum time period t. The major pulse and the minor pulse may be separated by the predetermined minimum time period t. The pulse width of the encoded signal Venc may be indicated by the time between a rising edge of the major pulse and a rising edge of the minor pulse. The predetermined minimum time period t may be selected so that a higher frequency pulse such as the "awake pulses" discussed in FIG. 1H may be added. The encoded signal may have better accuracy and may be more tolerance towards noise. FIG. 3C illustrates an additional encoded modulated signal by having a header pattern. A header pattern may be added preceding the actual pulse. The pulse width may be represented by a falling edge of a header pattern to the falling edge of the actual pulse. The encoded signals shown in FIG. 3C may be more tolerant to noise.

Referring to FIG. 3A, the receiver 360 of the second circuit 351 may comprise a detector 362, an optional amplifier 361, and a decoder 363 for receiving the signal transmitted by the transmitter 342 across the isolation barrier 302. The detector 362 may be receiving the encoded signal Venc. The encoded signal Venc may be decoded by the decoder 363. The decoder 363 may have an output that may be substantially similar to the modulated signal Vm. The second circuit 351 may further comprise a counter 370 and a frequency detector 384. Optionally, as shown in FIG. 3A, the counter 370 and the frequency detector 384 may be a portion of the control circuit 380.

The second clock generator 352 may be provided with the second circuit 351. The second clock generator 352 may be configured to generate a second clock signal. The receiver 360 may be coupled to the second clock generator 352 and may be configured to receive the modulated signal from the transmitter 342. The second clock generator 352 may comprise a second oscillator 356 having a second predetermined oscillating frequency substantially similar to the first predetermined oscillating frequency. The second predetermined oscillating frequency may be substantially larger than the first frequency or the second frequency so as to over sample the signals received from the transmitter 342 that may be modulated using the first frequency or the second frequency.

Similar to the isolation device 100 shown in FIG. 1A, the first and second oscillators 326, 356 may comprise substantially similar components arranged in a substantially similar manner.

The counter 370 may be configured to count the second clock signal in accordance with the modulated signal Vm. For example, the counter 370 may be configured to count only when the modulated signal Vm is in a predetermined state such as a digital HIGH. Optionally, the counter 370 may be configured to count for a first predetermined time period after the modulated signal transitions from a first predetermined state to a second predetermined state. The control circuit 380 may be configured to determine an indication of the first signal 391 corresponding to a count value of the counter 370.

During start-up, some portion of the second circuit 351 may not be ready for operation. The second circuit 351 may comprise a start-up circuit 374 configured to generate a power-up signal for a second predetermined time period when at least a portion of the second circuit is powered up. The power up signal may be in a first predetermined state indicating that the second circuit is not ready for operation. The counter 370 may be configured to cease counting when the power-up signal is in the first predetermined state. After all portions of the second circuit 351 are powered up, the power-up signal may be configured to transition to a second predetermined state. When this happens, the control circuit 380 may be configured to determine the indication of the first signal 391.

The demodulator 364 of the second circuit 351 may be a charge pump circuit configured to reconstruct the second signal 395. The control circuit 380 may comprise a frequency detector circuit 384 having filters to reconstruct the digital signal and all other digital signals. Alternatively, the control circuit 380 may be configured to reconstruct a portion or some of the first signal 391 through the count value of the counter 370. The isolation system 300 may have some other features illustrated in the embodiment shown in FIG. 1A although not explicitly discussed in FIG. 3A.

Figure 4:
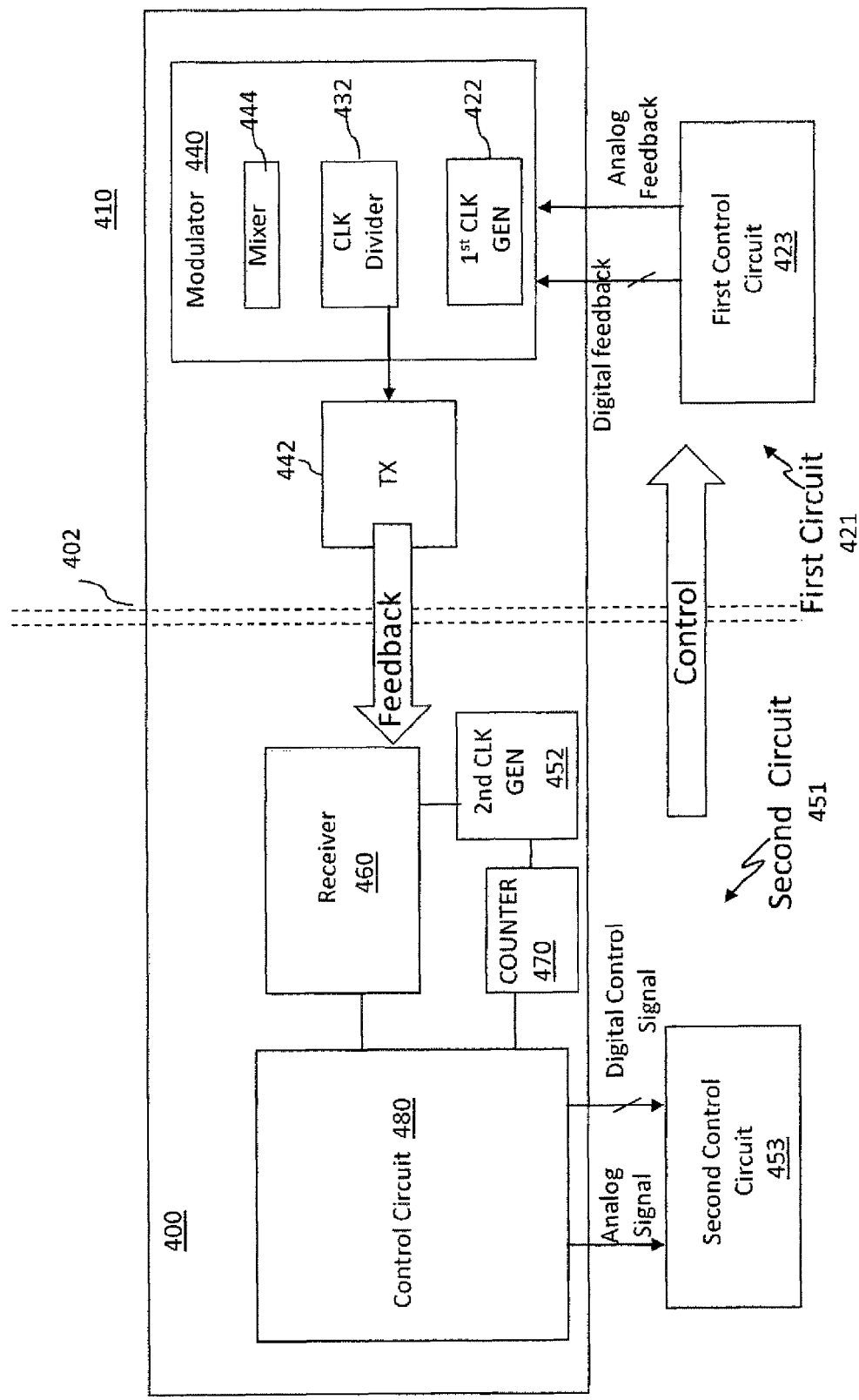
FIG. 4 illustrates a block diagram of a feedback control system having an isolation system.

The isolation device 200, the isolation device 300 and the isolation system 300 may be used in many applications involved in feedback control system across two isolated circuits. Examples of such feedback control systems may be shown in FIG. 4, FIG. 5 and FIG. 6. FIG. 4 illustrates a block diagram of a generic feedback control system 410 having an isolation system 400. The generic feedback control system 410 may comprise a first control circuit 423 and a second control circuit 453 in addition to the isolation system 400. Generally, the second control circuit 453 is configured to control the first control circuit 423 across an isolation barrier 402. Feedback from the first control circuit 423 to the second control circuit 453 may be provided through the isolation system 400.

The isolation system 400 may be the isolation device 100 as illustrated in FIG. 1A, the isolation device 200 as illustrated in FIG. 2A, or the isolation system 300 as illustrated in FIG. 3A. The isolation system 400 may comprise a transmitter 442 and a modulator 440 having a first clock generator 422, a clock divider 432 and a mixer 444. The modulator 440 may be configured to modulate an analog feedback signal, and/or one or more digital feedback signals so as to transmit the feedback signals across the isolation barrier 402. Additional analog feedback signal may be added in another embodiment. The isolation system 400 may further comprise a receiver 460, a second clock generator 452, a counter 470 and a control, circuit 480. The receiver 460, the second clock generator 452, the counter 470 and the control circuit 480 may be configured to receive and reproduce the feedback signals to the second control circuit 453.

The first control circuit 423 and a first portion of the isolation system 400 electrically coupled to the first control circuit 423 may be referred hereinafter as the first circuit 421. The first portion of the isolation system 400 may comprise the transmitter 442 and the modulator 440. The first circuit 421 may be electrically isolated from a second circuit 451 having a portion of the isolation system 400 such as the receiver 460, the second clock generator 452, the counter 470 and the control circuit 480.

Figure 5:
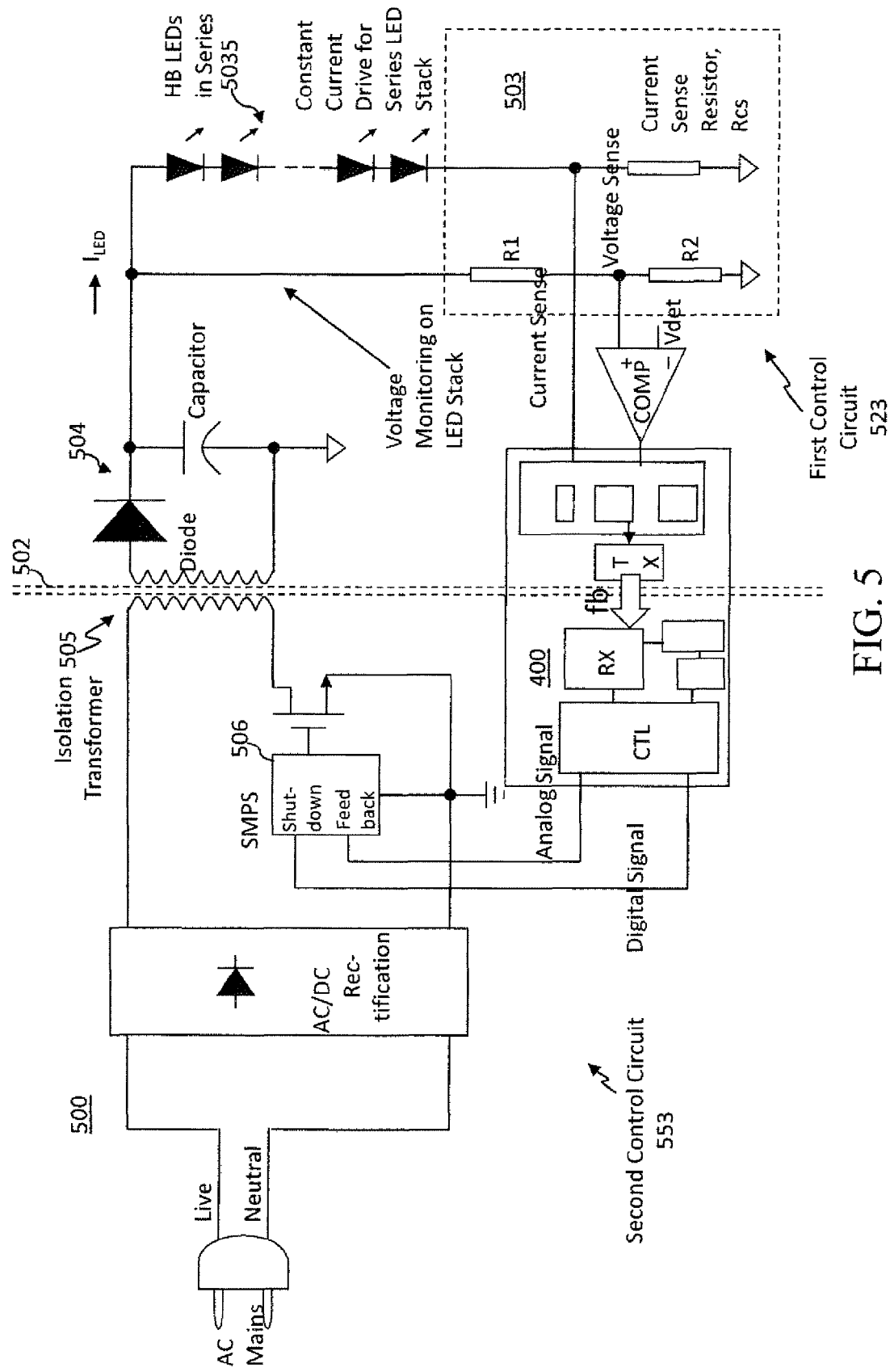
FIG. 5 illustrates a block diagram of a solid-state lighting system having the isolation system shown in FIG. 4.

Each of the isolation devices 100, 200 and isolation systems 300, 400 may form a portion of a solid-state lighting system. FIG. 5 illustrates a block diagram of a solid-state lighting system 500 having the isolation system 400 shown in FIG. 4. The solid-state lighting system 500 may have a first control circuit 523, a second control circuit 553, and the isolation system 400 that may be isolation devices 100, 200 or an isolation system 300 discussed in earlier embodiments.

The second control circuit 553 may be coupled to an AC power source, a rectification circuit and a power transformer 505 to supply power to the first control circuit 523 across an isolation barrier 502. The power transformer 505 may be controlled through a switch mode power supply (referred hereinafter as "SMPS") controller 506. The first control circuit 523 may comprise a rectifier circuit 504 and a plurality of light-emitting diodes 5035. Optionally, the rectifier circuit 504 may be coupled to additional regulation circuits (not shown). The first control circuit 523 may further comprise a monitoring circuit to provide feedback to the second control circuit through the isolation system 400.

Figure 6:
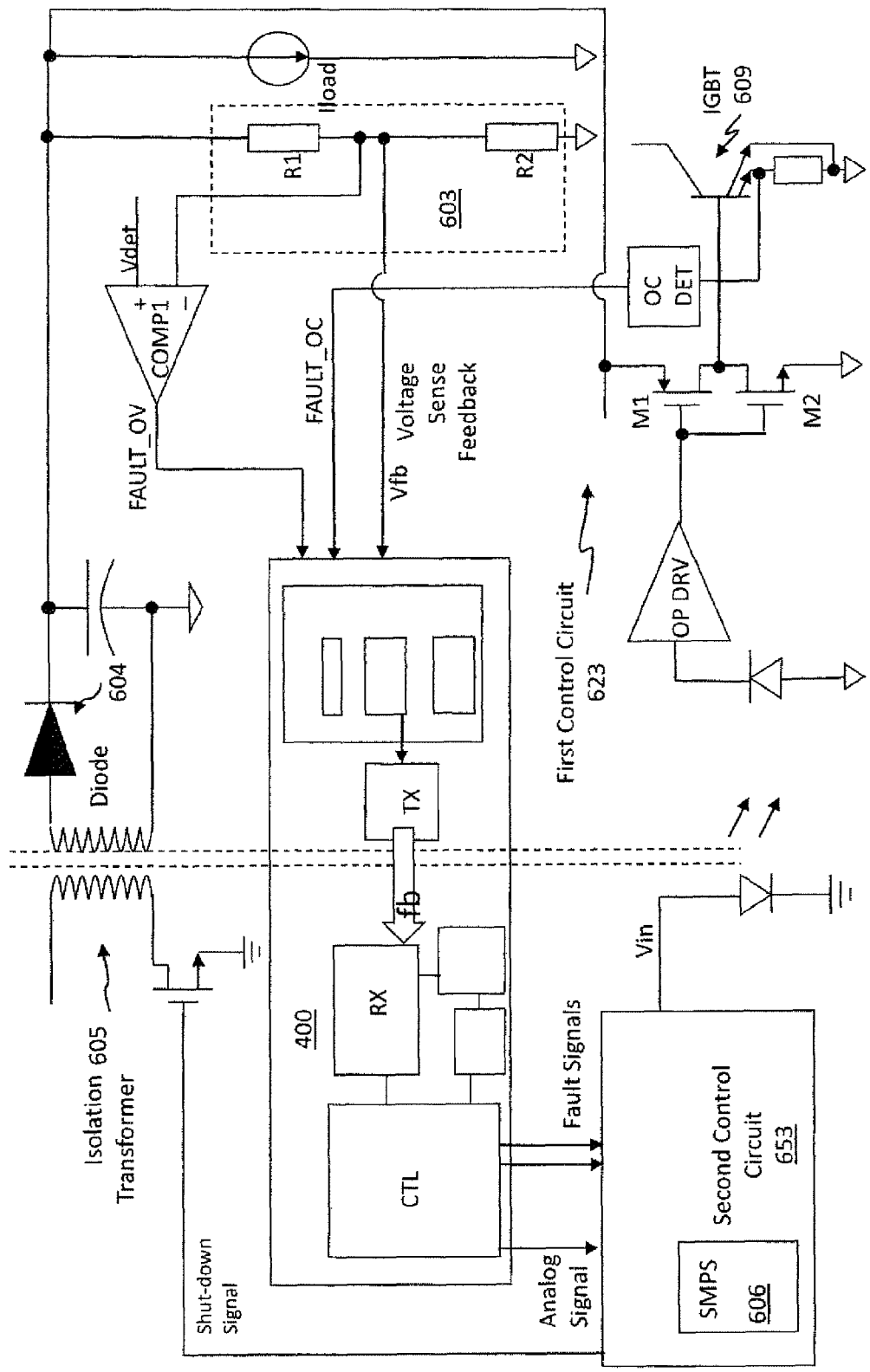
FIG. 6 illustrates a block diagram of a DC-DC feedback regulation control system having the isolation system shown in FIG. 4.

Each of the isolation devices 100, 200 and isolation systems 300, 400 may form a portion of a direct current to DC-DC feedback regulation system. FIG. 6 illustrates a block diagram of a DC-DC feedback regulation system 600 having the isolation system 400 shown in FIG. 4. The DC-DC feedback regulation system 600 may have a first control circuit 623, a second control circuit 653 and the isolation system 400 that may be isolation devices 100, 200 or an isolation system 300 discussed in earlier embodiments.

The second control circuit 653 may be configured to supply power to the first control circuit 623 across an isolation barrier 602. The power transformer 605 may be controlled through a switch mode power supply (referred hereinafter as "SMPS") controller 606. The first control circuit 623 may comprise a rectifier circuit 604 and an insulated gate bipolar transistor 609 (referred hereinafter as "IGBT"). The IGBT 609 may be configured to provide a direct current whereas the rectifier circuit 604 may be configured to provide a direct current source to the IGBT 609 from the power received through the power transformer 605. Optionally, the rectifier circuit 604 may be coupled to additional regulation circuits (not shown). The first control circuit 623 may further comprise a monitoring circuit 603 to provide feedback to the second control circuit through the isolation system 400.

Figure 7A:
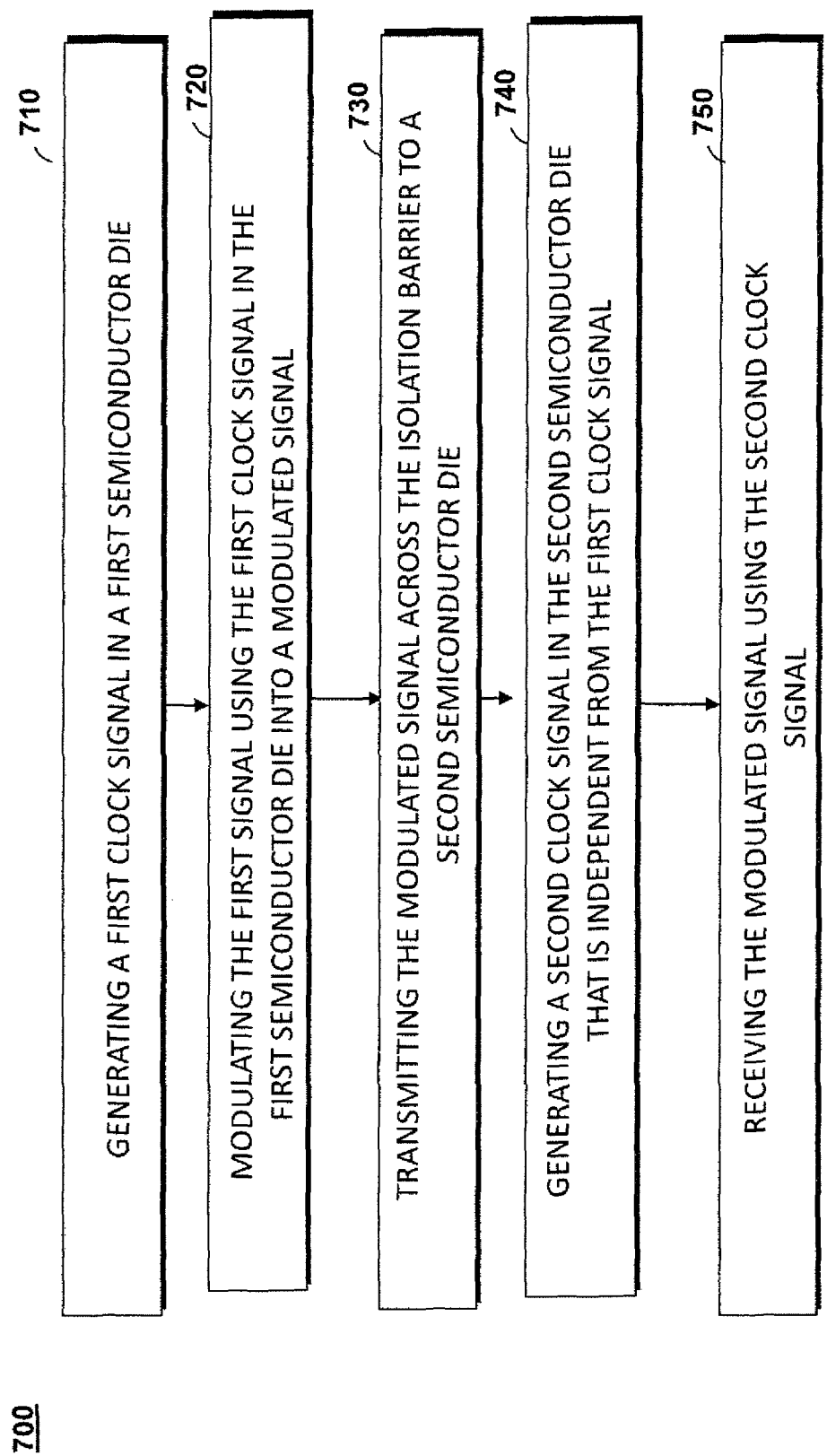
FIG. 7A illustrates a first method for conveying a first signal across an isolation barrier.

FIG. 7A illustrates a first method 700 for conveying a first signal across an isolation barrier. In step 710, a first clock signal in a first semiconductor die may be generated. Next, the first signal may be modulated using the first clock signal in the first semiconductor die into a modulated signal in step 720. The first method 700 may then proceeds to step 730 in which the modulated signal may be transmitted across the isolation barrier to a second semiconductor die. In the subsequent step 740, a second clock signal may be generated in the second semiconductor die that is independent from the first clock signal. In step 740, the modulated signal may be received using the second clock signal.

Figure 7B:
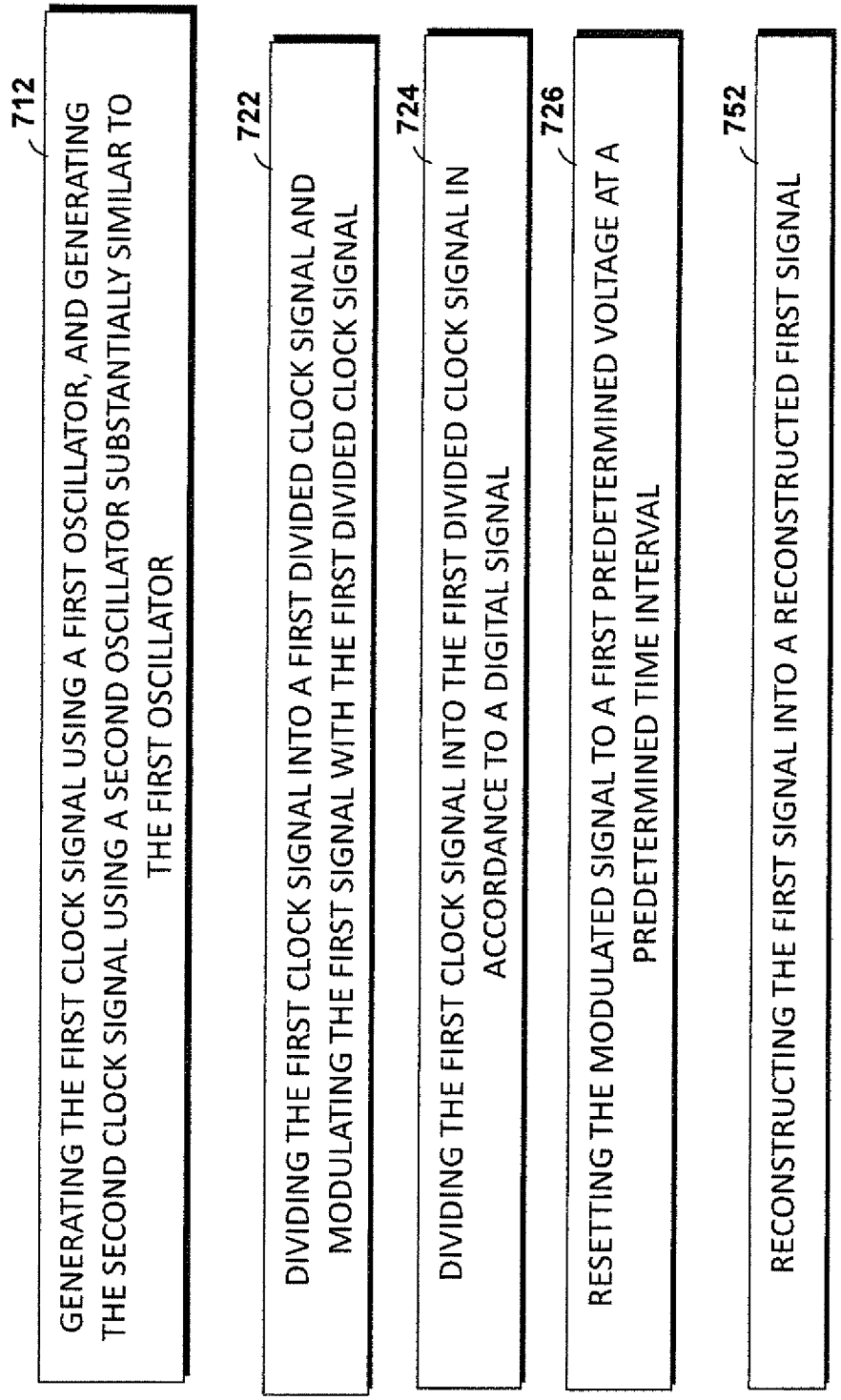
FIG. 7B illustrates additional optional steps of the first method shown in FIG. 7A.

The first method 700 may comprise other optional steps as illustrated in the embodiments shown in FIG. 1A, FIG. 2A, FIG. 3A, FIG. 4, FIG. 5, and FIG. 6. FIG. 7B illustrates some examples of additional optional steps of the first method 700 shown in FIG. 7A. In step 712 that may be performed after step 710, the first clock signal may be generated using a first oscillator, whereas the second clock signal may be generated using a second oscillator. The second clock signal may be substantially similar to the first clock signal generated in the first oscillator. Similarly, the second oscillator may be substantially similar to the first oscillator.

The step 720 may comprise step 722, in which the first clock signal may be divided into a first divided clock signal. The first signal may be modulated with the first divided clock signal in step 722. In addition, the step 720 may further comprise step 724 in which the first clock signal may be divided in accordance to a digital signal. The step 720 may further comprise step 726 in which the modulated signal may be reset to a first predetermined voltage at a predetermined time interval so as to maintain a common mode level. The step 750 may comprise step 752 in which the first signal may be reconstructed into a reconstructed first signal.

Figure 8A:
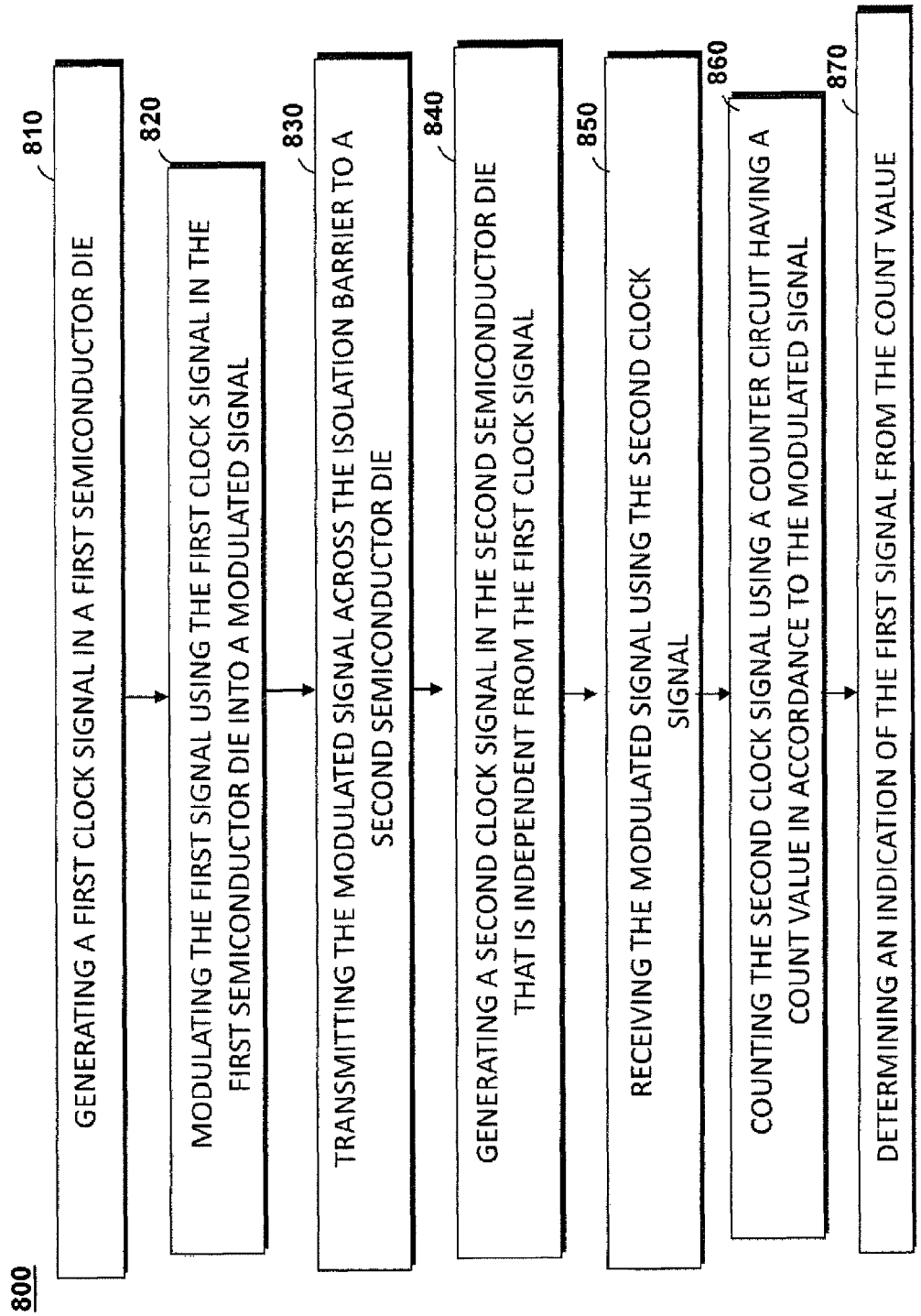
FIG. 8A illustrates a second method for conveying a first signal across an isolation barrier.

FIG. 8A illustrates a second method 800 for conveying a first signal across an isolation barrier. In step 810, a first clock signal may be generated in a first semiconductor die. Next, in step 820, the first signal may be modulated using the first clock signal into a modulated signal. In step 830, the modulated signal may be transmitted across the isolation bather to a second semiconductor die. Next, a second clock signal may be generated in the second semiconductor die in step 840. The second clock signal may be independent from the first clock signal. In step 850, the modulated signal may be received using the second clock signal. The receiver circuit may be configured to receive signal at every cycle of the second clock signal. In step 860, the second clock signal may be counted using a counter circuit in accordance to the modulated signal. The counter's count value may be stored as a recorded count value. In step 870, an indication of the first signal may be determined from the count value.

Figure 8B:
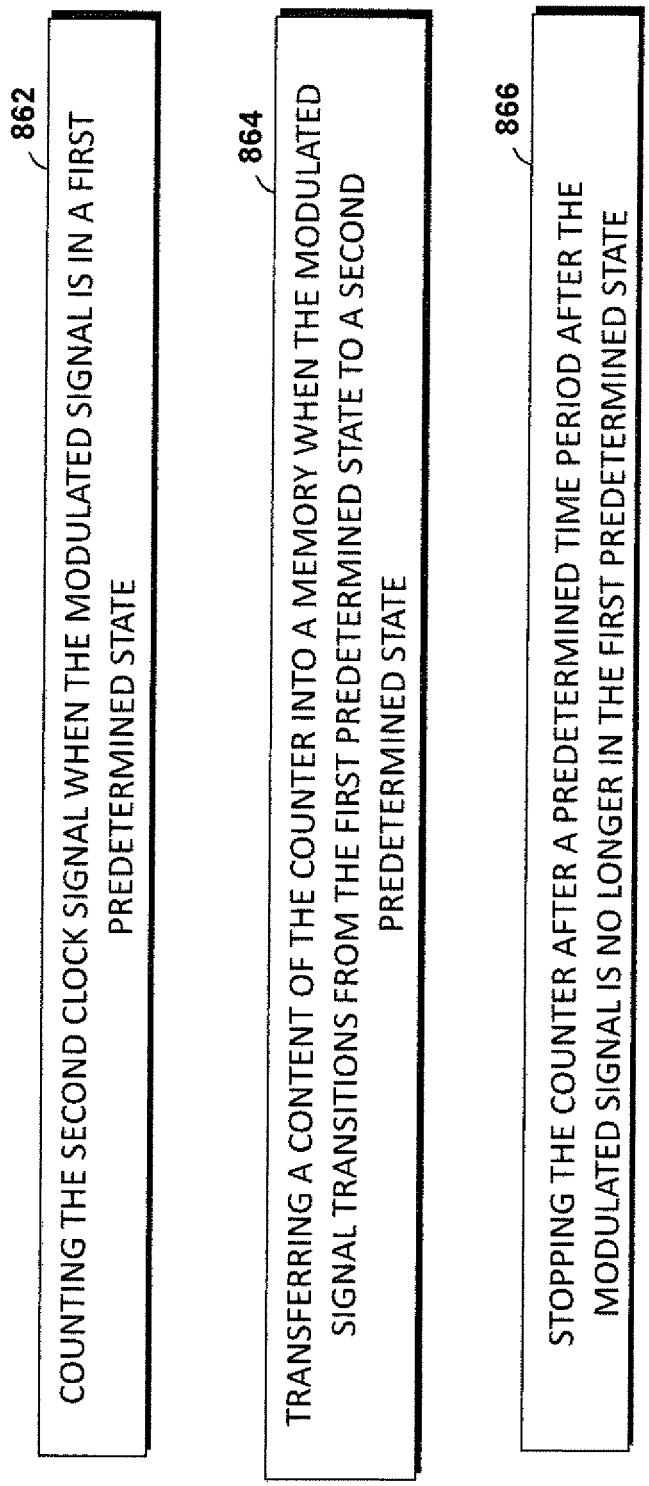
FIG. 8B illustrates additional optional steps of the second method shown in FIG. 8A.

FIG. 8B illustrates some examples of additional optional steps of the second method 800 shown in FIG. 8A. For example, the step 860 may comprise step 862 in which the second clock signal may be counted when the modulated signal is in a first predetermined state. Step 862 may be followed by step 864 in which a content of the counter may be transferred into a memory when the modulated signal transitions from the first predetermined state to a second predetermined state. Step 860 may further comprise step 866 in which the counter may be stopped after a predetermined time period after the modulated signal is no longer in the first predetermined state.

Different aspects, embodiments or implementations may, but need not, yield one or more of the following advantages. For example, the use of first and second clock that may have substantially similar frequency may be advantageous for the accuracy of the control circuit in determining an indication of a first signal transmitted over the isolation barrier. Various features illustrated in the Specification may be desirable improving communication accuracy. For example, the start-up circuit, the power monitoring circuit may be beneficial to prevent faulty communication.

Although specific embodiments of the invention have been described and illustrated herein above, the invention should not be limited to any specific forms or arrangements of parts so described and illustrated, but should also taking into consideration any combination of features illustrated in the same embodiment, or in other embodiments. The scope of the invention is to be defined by the claims appended hereto and their equivalents.

What is claimed is:

1. An isolation device, comprising:
   a first semiconductor die;
   a second semiconductor die formed adjacent to but electrically isolated from the first semiconductor die;
   a modulator, the modulator configured to modulate a first signal into a modulated pulse signal;
   a transmitter configured to transmit the modulated pulse signal from the first semiconductor die to the second semiconductor die, wherein the transmitter and the modulator reside within the first semiconductor die;
   a detector configured to receive the modulated pulse signal and, in response thereto, generate a received modulated pulse signal as output to the detector;
   a counter coupled to the detector, the counter configured to count in accordance to a pulse length of the received modulated pulse signal; and
   a control circuit configured to determine an indication of the first signal by using the counter.

2. The isolation device of claim 1 further comprising a start-up circuit configured to generate a power up signal, wherein the control circuit is configured to stop determining the indication of the first signal when the power up signal is activated.

3. The isolation device of claim 1, wherein the control circuit is configured to operate in a normal mode if the counter value is within a first count range exceeding a first predetermined value, wherein the control circuit is configured to continuously monitoring the first signal.

4. The isolation device of claim 3, wherein the control circuit is configured to operate in a first fault mode if the counter value exceeds at least two times the first predetermined value, wherein in the first fault mode, the control circuit is configured to control the isolation device such that the first signal is restored to a predetermined range.

5. The isolation device of claim 4, wherein the control circuit is configured to operate in a second fault mode if the counter value is less than approximately half of the first predetermined value, wherein in the second fault mode, the control circuit is configured to control the isolation device such that the first signal is restored to the predetermined range.

6. The isolation device of claim 1, wherein the counter is configured to start counting when the received modulated pulse signal is in a first predetermined state, and configured to stop counting when the received modulated pulse signal is in a second predetermined state, and wherein the counter is configured to generate a count value that is representative of the pulse length.

7. The isolation device of claim 6, wherein the counter is configured to count for a first predetermined time period after the received modulated pulse signal is configured to transition from the first predetermined state to the second predetermined state.

8. The isolation device of claim 7, wherein the counter is configured to continue counting when the received modulated pulse signal is configured to transition from the second predetermined state to the first predetermined state during the first predetermined time period.

9. The isolation device of claim 1, wherein the second semiconductor die is configured to be coupled to a power supply, and wherein the isolation device comprises a power monitor circuit configured to generate a voltage range signal that is indicative of whether the power supply is in a predetermined range.

10. The isolation device of claim 9 further comprising a fault detection circuit configured to determine a faulty condition of the first semiconductor die, wherein the fault detection circuit is configured to generate a first fault signal if the detector fails to receive the modulated pulse signal when the voltage range signal indicates that the power supply is in the predetermined range.

11. The isolation device of claim 9 further comprising:
    a fault detection circuit, wherein the fault detection circuit is configured to generate a second fault signal if the detector fails to receive the modulated pulse signal for a second predetermined time period after the voltage range signal is triggered; and
    a power controller configured to control the power supply to the first semiconductor die, wherein the power controller is configured to cut off the power supply to the first semiconductor die when the second fault signal is triggered.

12. An isolation system that isolates a first circuit from a second circuit with an isolation barrier, the isolation system comprising:
    a first clock generator provided within the first circuit, the first clock generator configured to generate a first clock signal;
    a mixer configured to modulate a first signal into a modulated signal using the first clock signal;
    a transmitter configured to transmit the modulated signal from the first circuit to the second circuit across the isolation barrier;
    a second clock generator provided within the second circuit, the second clock generator configured to generate a second clock signal;
    a receiver coupled to the second clock generator, the receiver configured to receive the modulated signal from the transmitter;
    a counter configured to count the second clock signal in accordance with the modulated signal; and
    a control circuit configured to determine an indication of the first signal corresponding to a count value of the counter.

13. The isolation system of claim 12, wherein the counter is configured to count for a first predetermined time period after the modulated signal transitions from a first predetermined state to a second predetermined state.

14. The isolation system of claim 13 further comprising a start-up circuit configured to generate a power-up signal for a second predetermined time period when at least a portion of the second circuit is powered up.

15. The isolation system of claim 14, wherein the control circuit is configured to determine the indication of the first signal when the power-up signal is in the second predetermined state different from the first predetermined state.

16. The isolation system of claim 12, wherein the mixer is configured to modulate an additional analog signal, and wherein the isolation system further comprises a charge pump circuit configured to reconstruct the additional analog signal.

17. The isolation system of claim 16, wherein the control circuit is configured to reconstruct the first signal in accordance to the counter.

18. The isolation system of claim 12, wherein the isolation system forms a portion of a direct current to direct current (DC-DC) feedback regulation system.

19. The isolation system of claim 12, wherein the isolation system forms a portion of a solid-state lighting system.

20. A direct current to direct current converter (DC-DC) feedback regulation control system comprising:
- a first circuit;
- an isolation barrier;
- a second circuit electrically isolated from the first circuit via the isolation barrier;
- a power controller of the second circuit;
- an isolation transformer configured to receive a current from the second circuit via the power controller, and configured to provide an output voltage therefrom to the first circuit across the isolation barrier;
- a power monitoring circuit of the first circuit configured to generate a first signal;
- a modulator configured to modulate the first signal into a modulated pulse signal;
- a transmitter configured to transmit the modulated pulse signal from the first circuit to the second circuit through the isolation barrier;
- a receiver configured to receive the modulated pulse signal into a received modulated pulse signal;
- a counter coupled to the receiver, the counter configured to count in accordance to a pulse length of the received modulated pulse signal; and
- a control circuit configured to determine an indication of the power monitoring circuit by using the counter.

* * * * *